United States Patent
Huang et al.

(10) Patent No.: US 12,368,132 B2
(45) Date of Patent: Jul. 22, 2025

(54) JOINT STRUCTURE IN SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Kuan-Yu Huang, Taipei (TW); Chih-Wei Wu, Yilan County (TW); Sung-Hui Huang, Yilan County (TW); Shang-Yun Hou, Hsinchu (TW); Ying-Ching Shih, Hsinchu (TW); Cheng-Chieh Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/749,542

(22) Filed: Jun. 20, 2024

(65) Prior Publication Data

US 2024/0339432 A1     Oct. 10, 2024

Related U.S. Application Data

(60) Continuation of application No. 17/872,023, filed on Jul. 25, 2022, now Pat. No. 12,087,727, which is a
(Continued)

(51) Int. Cl.
H01L 23/00     (2006.01)

(52) U.S. Cl.
CPC .............. H01L 24/81 (2013.01); H01L 24/11 (2013.01); H01L 24/13 (2013.01); H01L 24/14 (2013.01);
(Continued)

(58) Field of Classification Search
None
See application file for complete search history.

(56) References Cited

U.S. PATENT DOCUMENTS

| | | | |
|---|---|---|---|
| 10,978,401 B2 * | 4/2021 | Lin | ...................... H01L 21/4857 |
| 2009/0275172 A1 * | 11/2009 | Suzuki | .................... H01L 24/29 |
| | | | 257/E21.705 |

(Continued)

FOREIGN PATENT DOCUMENTS

| | | |
|---|---|---|
| CN | 1835229 | 9/2006 |
| CN | 101944496 | 1/2011 |
| JP | 2005072212 | 3/2005 |

*Primary Examiner* — Hung K Vu
(74) *Attorney, Agent, or Firm* — JCIPRNET

(57) ABSTRACT

A method of forming a semiconductor package includes: forming a first package component including a first and a second conductive bumps; forming a second package component including a third and a fourth conductive bumps, where dimensions of the first and second conductive bumps are less than dimensions of the third and fourth conductive bumps; and forming a first and a second joint structures to bond the second package component to the first package component. A first angle between an exposed sidewall of the first conductive bump and a tangent line at an end point of a boundary of the first joint structure on the sidewall of the first conductive bump is less than a second angle between an exposed sidewall of the second conductive bump and a tangent line at an end point of a boundary of the second joint structure on the sidewall of the second conductive bump.

20 Claims, 27 Drawing Sheets

Related U.S. Application Data division of application No. 16/924,147, filed on Jul. 8, 2020, now Pat. No. 11,502,056.

(52) U.S. Cl.
CPC ...... *H01L 24/16* (2013.01); *H01L 2224/1146* (2013.01); *H01L 2224/13083* (2013.01); *H01L 2224/13147* (2013.01); *H01L 2224/13155* (2013.01); *H01L 2224/14132* (2013.01); *H01L 2224/16148* (2013.01); *H01L 2224/81125* (2013.01); *H01L 2224/81193* (2013.01); *H01L 2224/81815* (2013.01); *H01L 2224/81908* (2013.01); *H01L 2924/3511* (2013.01)

(56) References Cited

U.S. PATENT DOCUMENTS

| | | |
|---|---|---|
| 2010/0140796 A1 | 6/2010 | Ishido et al. |
| 2013/0168854 A1* | 7/2013 | Karikalan ............... H01L 24/73 257/784 |

* cited by examiner

JOINT STRUCTURE IN SEMICONDUCTOR PACKAGE AND MANUFACTURING METHOD THEREOF

CROSS-REFERENCE TO RELATED APPLICATION

This application is a continuation application of and claims the priority benefit of a prior application Ser. No. 17/872,023, filed on Jul. 25, 2022, now allowed. The prior application Ser. No. 17/872,023 is a divisional application of U.S. application Ser. No. 16/924,147, filed on Jul. 8, 2020. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. These smaller electronic components also require smaller packages that occupy less area than previous packages. Thus, new packaging technologies have begun to be developed. For example, some packages rely on bumps of solder to provide an electrical connection, and the different layers making up the interconnection in the packages have different coefficients of thermal expansion (CTEs). As a result, a relatively large stress derived from this difference is exhibited on the joint area, which causes the risk of delamination and/or cold joint. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
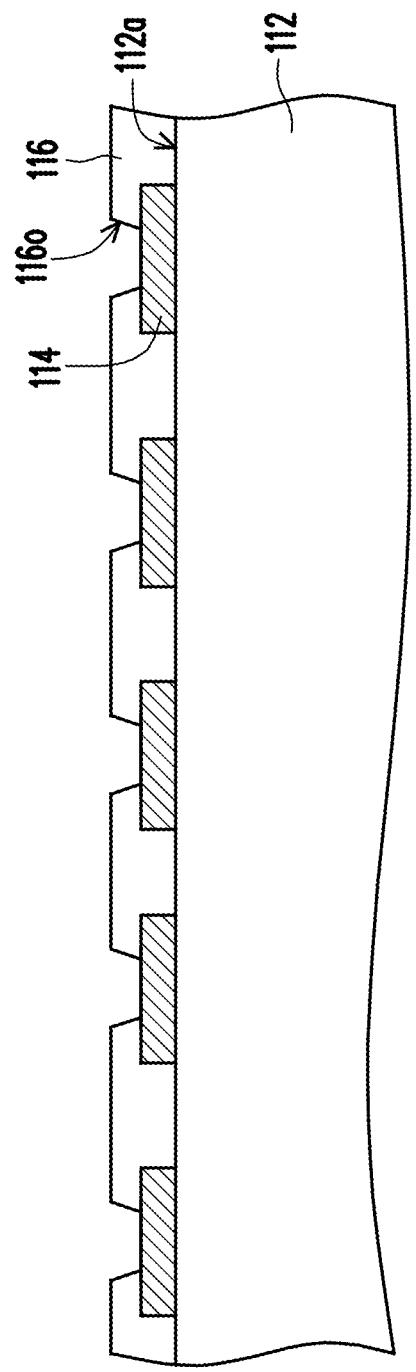
FIGS. 1A-1D are schematic cross-sectional views of various stages of manufacturing conductive bumps of a first package component in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Various embodiments of bonding any two package components together are described with respect to a particular context. For example, various embodiments may be used to bond a device die, a device wafer, a fan-out package, a package substrate, an interposer, a printed circuit board, a mother board, and the like to another device die, device wafer, fan-out package, package substrate, interposer, printed circuit board, mother board, and the like.

Figure 1B:
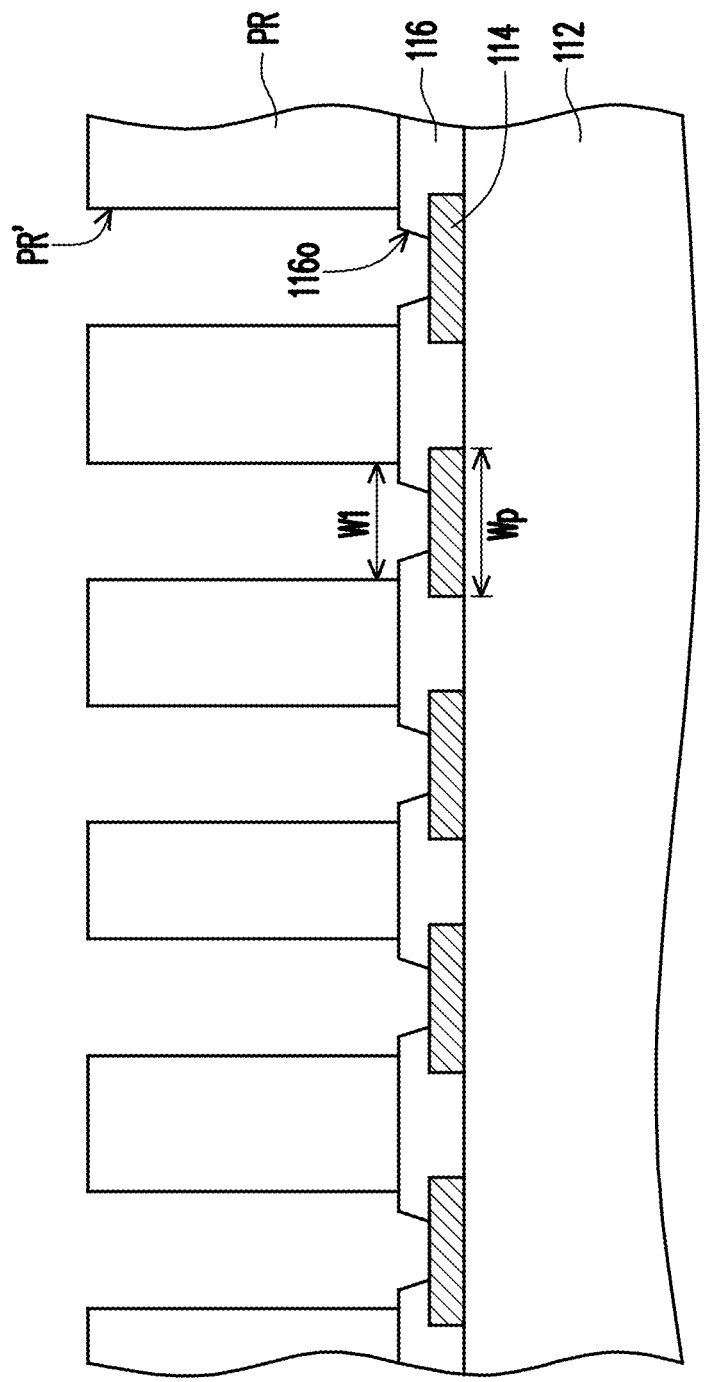
Figure 1C:
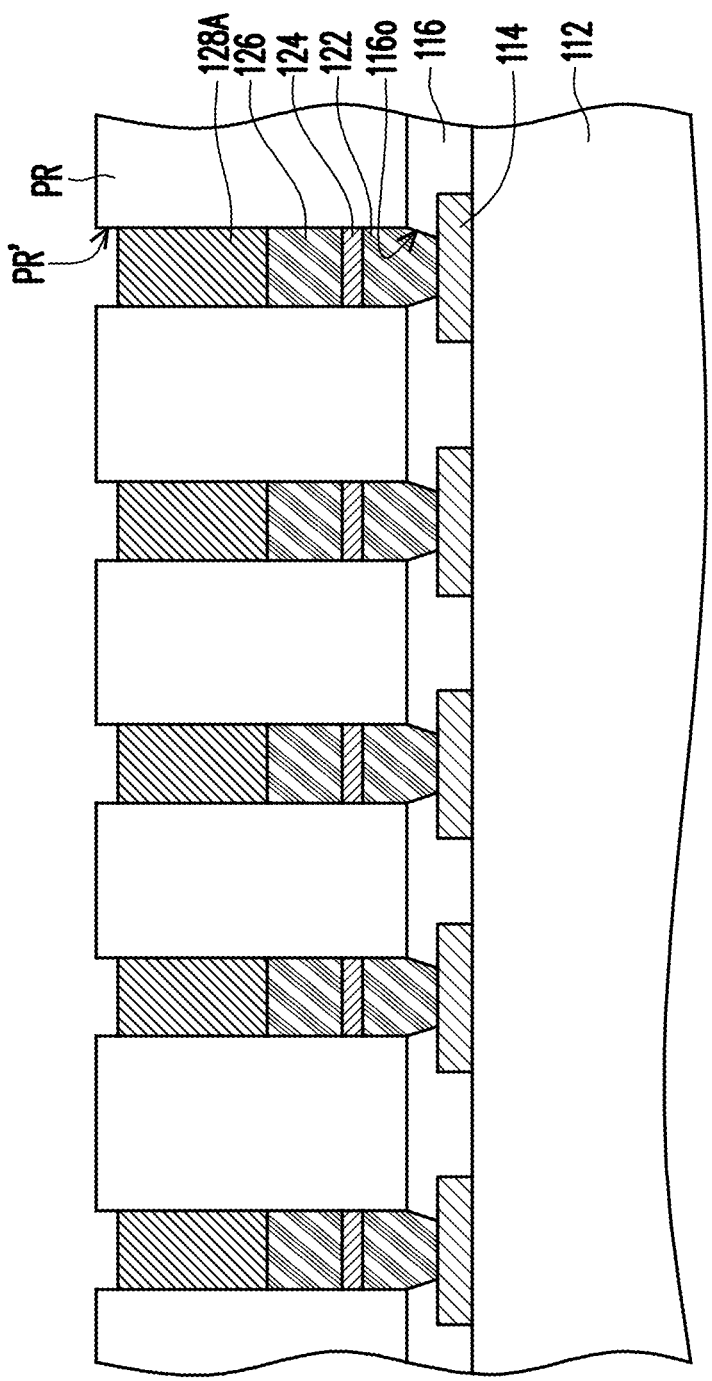
Figure 1D:
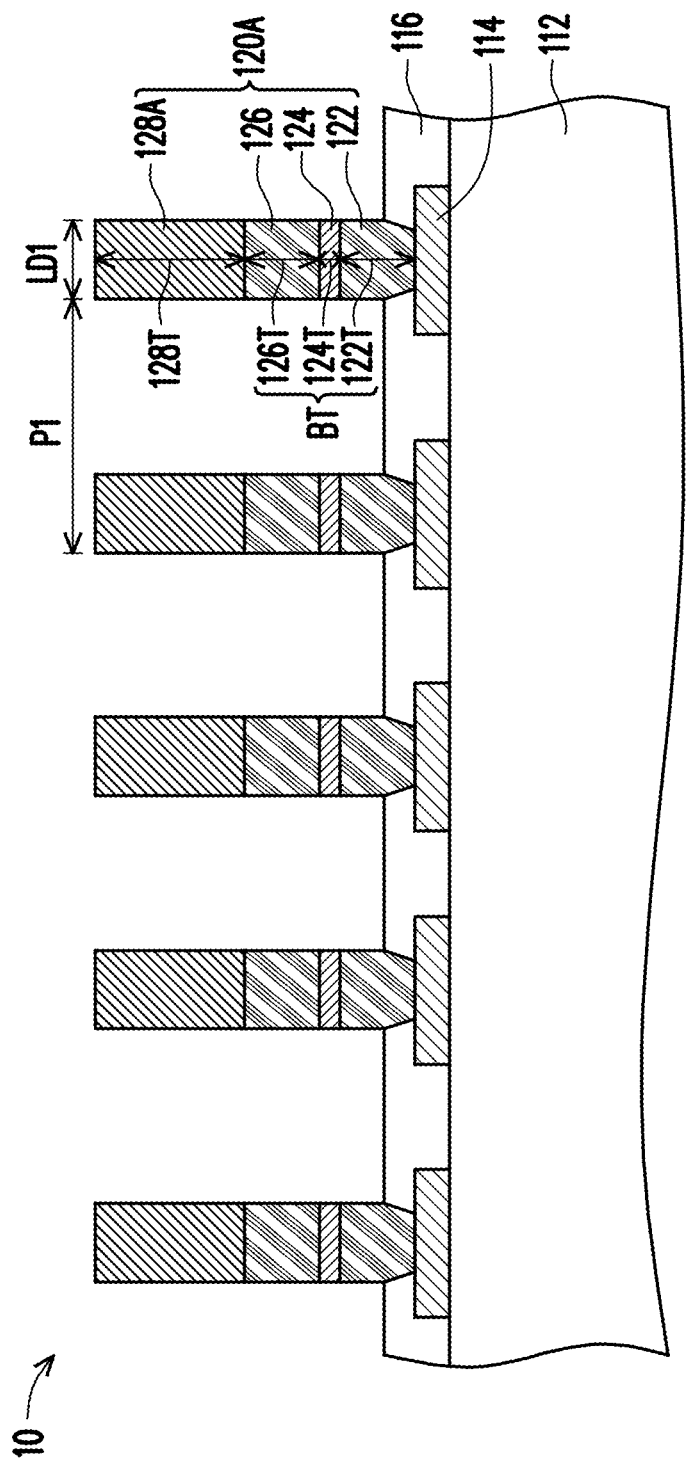
Figure 2:
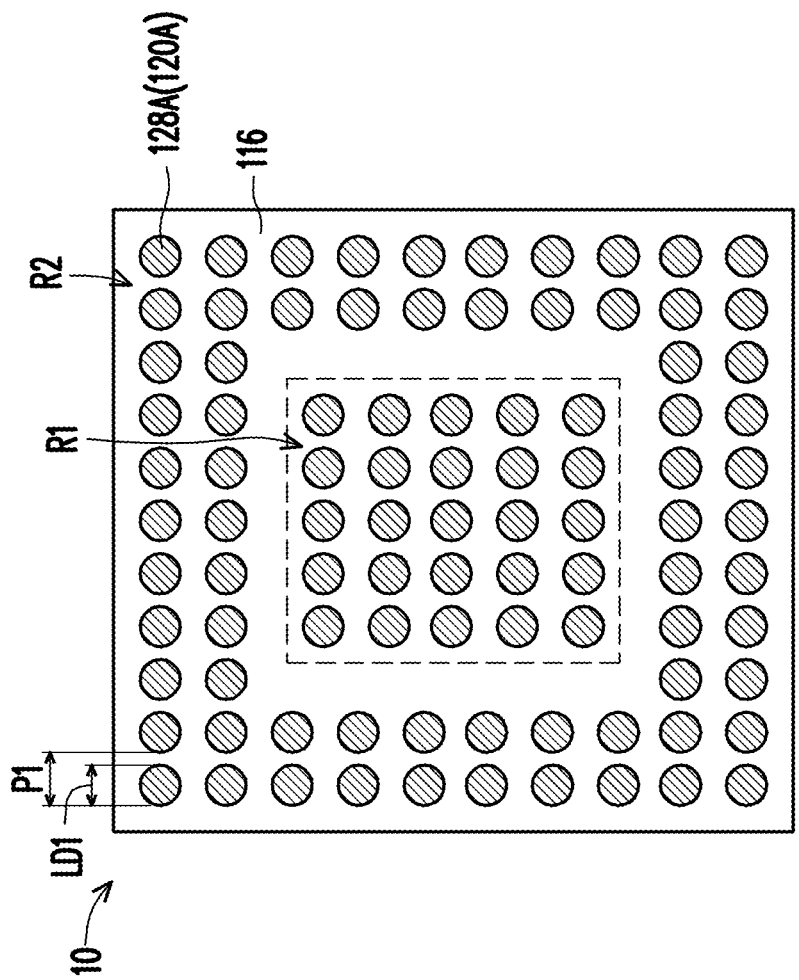
FIG. 2 is a schematic top view of a first package component including conductive bumps in accordance with some embodiments.

FIGS. 1A-1D are schematic cross-sectional views of various stages of manufacturing conductive bumps of a first package component in accordance with some embodiments, and FIG. 2 is a schematic top view of a first package component including conductive bumps in accordance with some embodiments. Referring to FIG. 1A, a plurality of first conductive pads 114 may be distributed over a major surface 112a (e.g., top surface) of a first semiconductor substrate 112, and a first passivation layer 116 may be formed on the major surface 112a of the first semiconductor substrate 112 to partially cover the first conductive pads 114.

For example, the first semiconductor substrate 112 includes a bulk semiconductor, a semiconductor-on-insulator (SOI) substrate, other supporting substrate (e.g., quartz, glass, etc.), combinations thereof, or the like, which may be doped or undoped. In some embodiments, the first semiconductor substrate 112 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. For example, the compound semiconductor substrate has a multilayer structure, or the substrate includes a multilayer compound semiconductor structure. In some embodiments, the alloy SiGe is formed over a silicon substrate. Alternatively, a SiGe substrate is strained. The first semiconductor substrate 112 may include the semiconductor devices (not shown) formed therein or thereon, and the semiconductor devices may be or may include active devices (e.g., transistors, diodes, etc.) and/or passive devices (e.g., capacitors, resistors, inductors, etc.), or other suitable electrical components. In some embodiments, the semiconductor devices are formed at the side of the first semiconductor substrate 112 proximal to the major surface 112a. In some embodiments, the first semiconductor substrate 112 is free of active and/or passive devices formed therein.

In some embodiments, the first semiconductor substrate 112 includes circuitry (not shown) formed in a front-end-of-line (FEOL), and an interconnect structure (not shown) disposed over the major surface 112a of the first semiconductor substrate 112 is formed in a back-end-of-line (BEOL). The interconnect structure may be electrically coupled to the semiconductor devices formed in and/or on the first semiconductor substrate 112 to one another and to electrical components (e.g., test pads, bonding connectors, etc.). The semiconductor devices and metallization patterns may be interconnected to perform one or more functions including memory structures (e.g., memory cell), processing structures, input/output circuitry, or the like. In some embodiments, the interconnect structure includes an inter-layer dielectric (ILD) layer formed over the first semiconductor substrate 112 and covering the semiconductor devices, and an inter-metallization dielectric (IMD) layer formed over the ILD layer.

The first conductive pads 114 formed over the first semiconductor substrate 112 may include aluminum pads. For example, the material of the first conductive pads 114 includes aluminum, copper, silver, gold, nickel, tungsten, alloys thereof, and/or multi-layers thereof. In some embodiments, the first conductive pads 114 are disposed over and electrically coupled to the interconnect structure, and the semiconductor devices formed in the first semiconductor substrate 112 are electrically coupled to the first conductive pads 114 through the interconnect structure. In some embodiments, the material of the first passivation layer 116 includes polybenzoxazole (PBO), polyimide (PI), benzocyclobutene (BCB), or other non-organic material such as un-doped silicate glass (USG), silicon nitride, silicon oxynitride, silicon oxide, and multi-layers thereof. For example, the first passivation layer 116 includes openings 1160 accessibly exposing at least a portion of the first conductive pads 114 for further electrical connection. It is appreciated that the number of conductive pads and a single passivation layer are shown for illustrative purposes only, and other embodiments may include any number of conductive pads and/or passivation layers.

Referring to FIG. 1B, a patterned mask layer PR is formed on the first passivation layer 116. For example, the patterned mask layer PR includes openings PR' exposing portions of the first conductive pads 114 for bump formation. In some embodiments, the openings PR' of the patterned mask layer PR are in communication with the openings 1160 of the first passivation layer 116 to accessibly expose the underlying first conductive pads 114. The patterned mask layer PR may define the lateral boundaries of the conductive bumps to be subsequently formed. In some embodiments, the opening PR' of the patterned mask layer PR has a width W1 less than the width Wp of the corresponding first conductive pad 114. In other embodiments, the width W1 of the opening PR' is greater than or substantially equal to the width Wp of the corresponding first conductive pad 114. The patterned mask layer PR may be a dry film or a photoresist film used through the steps of coating, curing and/or the like, followed by lithography techniques and/or etching processes such as a dry etching and/or a wet etching process.

Referring to FIGS. 1C-1D, the openings PR' of the patterned mask layer PR may be filled with layers of conductive materials, and then the patterned mask layer PR may be removed. The formation methods of the layers of conductive materials (e.g., a first conductive layer 122, a second conductive layer 124, a third conductive layer 126, and a fourth conductive layer 128A) may include plating, sputtering, printing, electrochemical deposition, atomic layer deposition, chemical vapor deposition, and/or other suitable methods. In some embodiments, the layers of conductive materials are sequentially plated on the first conductive pads 114. For example, the first conductive layer 122 is initially formed on the portions of the first conductive pads 114 exposed by the first passivation layer 116 and the patterned mask layer PR. In some embodiments, the first conductive layer 122 is a copper-containing layer. The first conductive layer 122 may include pure elemental copper, copper containing impurities, and/or copper alloys containing minor amounts of elements such as indium, titanium, tantalum, chromium, tin, zinc, manganese, germanium, platinum, magnesium, aluminum, etc.

Next, the second conductive layer 124 is formed on the first conductive layer 122. In some embodiments, the second conductive layer 124 and the first conductive layer 122 are of different materials. For example, the second conductive layer 124 is a nickel-containing layer. The second conductive layer 124 may include nickel, tin, tin-lead, gold, silver, platinum, palladium, Indium, nickel-palladium-gold, nickel-gold, other similar materials, or alloys. Next, the third conductive layer 126 may be formed on the second conductive layer 124. The third conductive layer 126 may include the same/similar conductive material(s) as the first conductive layer 122. For example, the first conductive layer 122 and the third conductive layer 126 are both copper-containing layer, and the second conductive layer 124 interposed therebetween may serve as a barrier layer. In some embodiments, the third conductive layer 126 is omitted. Subsequently, the fourth conductive layer 128A may be formed on the third conductive layer 126. In some embodiments, the material of the fourth conductive layer 128A is different from the underlying conductive layers (122, 124, and 126). For example, the fourth conductive layer 128A is a solder-containing layer. The fourth conductive layer 128A may include lead-free solder, such as tin, SnAg, tin bismuth (SnBi) solder, copper (SAC) solder, and/or combinations thereof, or the like.

After the layers of conductive materials are sequentially formed on the first conductive pads 114, the patterned mask layer PR may be removed to expose portions of the first passivation layer 116. In some embodiments in which the patterned mask layer PR is formed from the photoresist material, the photoresist may be stripped by a chemical solution or another stripping process. Other suitable removal process (e.g., ashing, etching, a combination thereof, etc.) may be used to remove the patterned mask layer PR. Thereafter, the first conductive bumps 120A are completed on the first conductive pads 114, respectively.

Continue to FIG. 1D and also with reference to FIG. 2, a first package component 10 including the first conductive bumps 120A is provided. The first package component 10 may be a semiconductor die (or chip) that is or includes any type of integrated circuit, such as a processor, logic circuitry, memory, analog circuit, digital circuit, mixed signal, and the like. In some embodiments, the first package component 10 is a bridge die for interconnecting other package components as will be described later in other embodiments. The top-view profile of the first conductive bumps 120A may be circular in accordance with some embodiments. Although the illustrated first conductive bumps 120A are circular in shape, the first conductive bumps 120A may have any shape, such as, ovular, rectangular, polygonal, combinations of these, and/or the like.

Still referring to FIG. 2, the first package component 10 includes at least a first region R1 and a second region R2 surrounding the first region R1, and the first conductive bumps 120A are distributed in an array over the first region R1 and the second region R2. The first region R1 may be in the central region of the first package component 10, and the second region R2 may be along the peripheral region of the first package component 10. In some embodiments, the first conductive bumps 120A are formed with the same/similar critical dimension(s) on different regions within the first package component 10. For example, the first conductive bumps 120A in the first region R1 and the second region R2 have substantially uniform lateral dimensions LD1 (also referring to diameter or width of the first conductive bumps 120A). In other words, the lateral dimensions LD1 of the first conductive bumps 120A across the first package component 10 may be kept constant in different regions. In some embodiments, the lateral dimension LD1 is in a range from about 10 µm to about 30 µm. The bump heights of the first conductive bumps 120A across the first package component 10 may be kept constant in different regions as well. Alternatively, the first conductive bumps 120A may be non-uniform in size due to formation process variations. For example, the first conductive bumps 120A located in the corners of the first package component 10 may have a size slightly larger than the first conductive bumps 120A located in the center of the first package component 10. It is noted that the first conductive bumps 120A may exhibit any suitable lateral dimensions LD1 and bump height.

The dimensions and characteristics of the first conductive bumps 120A further include a bump pitch P1, which presents a distance between two adjacent first conductive bumps 120A. In some embodiments, the bump pitch P1 is in a range from about 20 µm to about 60 µm, although the bump pitch P1 may be greater or smaller in other embodiments. It is noted that the dimensions recited throughout the description are merely examples and will change if different formation techniques are used. In some embodiments, the first conductive bumps 120A are uniformly distributed across the first package component 10. In some embodiments, dummy bumps (not shown) are formed at strategic locations to control the distribution and/or uniformity of bump heights across the first package component 10. In some embodiments, the first conductive bumps 120A located in the first region R1 have a bump density different from a bump density of the first conductive bumps 120A distributed in the second region R2. The bump density in the first region R1 may be denser or sparser than the bump density in the second region R2 depending on die configuration, which is not limited in the disclosure.

Still referring to FIG. 1D, the thickness 122T of the first conductive layer 122 may be measured from the interface between the first conductive pad 114 and the first conductive layer 122 to the interface between the first conductive layer 122 and the second conductive layer 124. For example, the first conductive layer 122 is of about 2-5 µm in thickness, although the thickness 122T may be greater or smaller. In some embodiments, the thickness 122T of the first conductive layer 122 and the thickness 126T of the third conductive layer 126 are substantially equal. Alternatively, the thickness 122T of the first conductive layer 122 may be greater than or less than the thickness 126T of the third conductive layer 126 as will be discussed later in other embodiments. In some embodiments, the thickness 124T of the second conductive layer 124 is less than the thickness 122T of the first conductive layer 122 and/or the thickness 126T of the third conductive layer 126. For example, the second conductive layer 124 is of about 2 µm to 10 µm in thickness, but the thickness 124T may be varied. Alternatively, the thickness 124T of the second conductive layer 124 is greater than the thickness 122T of the first conductive layer 122 and/or the thickness 126T of the third conductive layer 126 as will be discussed later in other embodiments.

The combination of the thicknesses (122T, 124T, and 126T) may be viewed as a total bump height BT of the first conductive bump 120A. In some embodiments, a ratio of the thickness 124T of the second conductive layer 124 to the total bump height BT is in a range from about 0.1 to about 0.4. In some embodiments, a ratio of the thickness 128T of the fourth conductive layer 128A to the total bump height BT is in a range from about 0.1 to about 0.7. In some embodiments, the fourth conductive layer 128A of the respective first conductive bump 120A has a substantially uniform thickness 128T. The thickness 128T of the fourth conductive layer 128A may vary depending on a reflow temperature and an estimated distance between package components. Further details will be discussed below.

Figure 3:
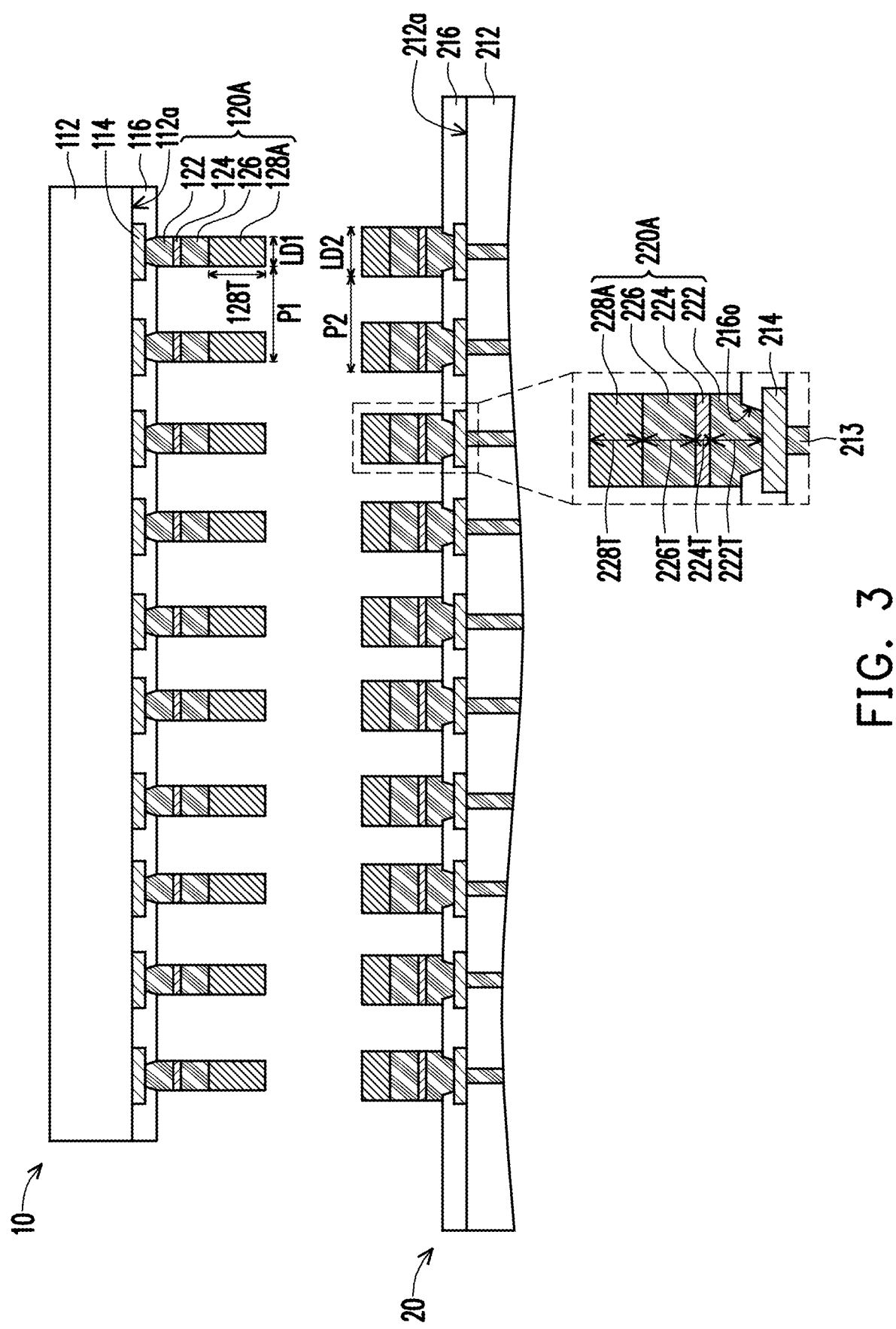
FIG. 3 is a schematic cross-sectional view illustrating package components to be attached in accordance with some embodiments.
Figure 4:
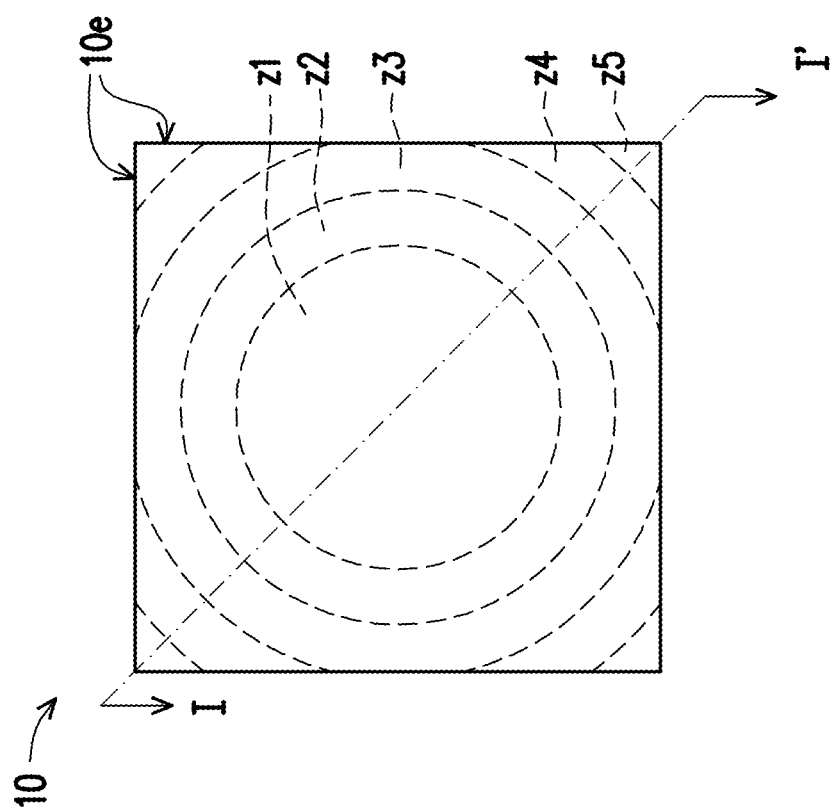
FIG. 4 is a schematic top view of a warpage distribution of a first package component in accordance with some embodiments.

FIG. 3 is a schematic cross-sectional view illustrating package components to be attached in accordance with some embodiments, and FIG. 4 is a schematic top view of a warpage distribution of a first package component in accordance with some embodiments. Referring to FIGS. 3-4, the first package component 10 and a second package component 20 are designed and fabricated, respectively, and then the first package component 10 (e.g., a semiconductor die) is to be attached to the second package component 20 (e.g., an interposer, an integrated fan-out wafer, a package substrate, a printed circuit board, a mother board, and the like). In some embodiments, the size of the first package component 10 is less than that of the second package component 20. For example, the second package component 20 includes a second semiconductor substrate 212, a plurality of second conductive pads 214 distributed over a major surface 212a of the second semiconductor substrate 212, and a second passivation layer 216 formed on the major surface 212a of the second semiconductor substrate 212 to partially cover the second conductive pads 214. The area of the major surface 112a of the first package component 10 may be less than the major surface 212a of the second package component 20. In some embodiments, the second package component 20 includes a plurality of through substrate vias (TSVs) 213 penetrating through the second semiconductor substrate 212 and connected to the second conductive pads 214 for providing vertical and electrical connection between opposing sides of the second semiconductor substrate 212. Alternatively, TSVs 213 are omitted.

The second semiconductor substrate 212 may include silicon, gallium arsenide, semiconductor-on-insulator or other similar materials. In some embodiments, the material of the second semiconductor substrate 212 is similar to that of the first semiconductor substrate 112 of the first package component 10. In some embodiments, the second semiconductor substrate 212 includes FR-4, bismaleimide triazine (BT) resin, ceramic, glass, or other supporting materials that may carry the second conductive pads 214. The second semiconductor substrate 212 may include passive devices (e.g., resistors, capacitors, inductors, etc.) or active devices (e.g., transistors). The second semiconductor substrate 212 may include additional integrated circuits. The second conductive pads 214 of the second package component 20 may include a conductive material such as pure copper, aluminum copper, metal alloy, and/or other metallic materials. The second passivation layer 216 includes openings 216O accessibly revealing at least a portion of the second conductive pads 214 for further electrical connection. The second passivation layer 216 may be formed of polyimide or other suitable dielectric materials such as silicon oxide, silicon nitride, undoped silicate glass (USG), polyimide, and/or multi-layers thereof. In some embodiments, the second passivation layer 216 is a resist film. The second conductive pads 214 may be similar to the first conductive pads 114, and the second passivation layer 216 may be similar to the first passivation layer 116. In some embodiments, the second conductive pads 214 are electrically connected to the TSVs 213 through metal lines and vias (not shown) that are formed in dielectric layers (also not shown).

Continue to FIG. 3, the second package component 20 may include a plurality of second conductive bumps 220A formed on the second conductive pads 214. For example, the second conductive bumps 220A are physically and electrically connected to the second conductive pads 214 through the openings 216O in the second passivation layer 216. The formation process of the second conductive bumps 220A may be similar to that of the first conductive bumps 120A. For example, the respective second conductive bump 220A includes a first conductive layer 222 formed on the corresponding second conductive pad 214, a second conductive layer 224 formed on the first conductive layer 222, a third conductive layer 226 formed on the second conductive layer 224, and a fourth conductive layer 228A formed on the third conductive layer 226. The materials of the first conductive layer 222, the second conductive layer 224, the third conductive layer 226, and the fourth conductive layer 228A may be respectively the same as or similar to those of the first conductive layer 122, the second conductive layer 124, the third conductive layer 126, and the fourth conductive layer 128A.

In some embodiments, the thickness 222T of the first conductive layer 222 is substantially equal to the thickness 226T of the third conductive layer 226. Alternatively, the thickness 222T of the first conductive layer 222 may be greater than or less than the thickness 226T of the third conductive layer 226. In some embodiments, the thickness 224T of the second conductive layer 224 is less than the thickness 222T of the first conductive layer 222 and/or the thickness 226T of the third conductive layer 226. Alternatively, the thickness 224T of the second conductive layer 224 is greater than the thickness 222T of the first conductive layer 222 and/or the thickness 226T of the third conductive layer 226. In some embodiments, the fourth conductive layer 228A of the respective second conductive bump 220A has a substantially uniform thickness 228T. The thickness 228T of the fourth conductive layer 228A may vary depending on an reflow temperature and/or an estimated distance between package components.

Still referring to FIG. 3, one of the differences between the first conductive bumps 120A of the first package component 10 and the second conductive bumps 220A of the second package component 20 is that the critical dimension of the respective first conductive bump 120A is less than the critical dimension of the corresponding second conductive bump 220A. For example, the lateral dimension (e.g., maximum width) LD1 of the first conducive bump 120A is less than the lateral dimension (e.g., maximum width) LD2 of the second conductive bump 220A. In some embodiments, a ratio of the lateral dimension LD1 of the first conducive bump 120A to the lateral dimension LD2 of the second conductive bump 220A is substantially equal to or greater than 0.3. In some embodiments, the ratio (LD1/LD2) is about 0.5 to 0.7. In some embodiments, the ratio (LD1/LD2) is substantially equal to or less than 0.9. The ratio (LD1/LD2) may be in a range from about 0.3 to about 1, or less than 1. In some embodiments where the first conducive bump 120A and/or the second conductive bump 220A are of elliptical/rectangular shapes in the top view, the dimension of the major axis of the first conducive bump 120A is less than that of the major axis of the second conductive bump 220A. The dimension of the major axis of the first conducive bump 120A may be less than, equal to, or greater than the dimension of the minor axis of the second conductive bump 220A. Alternatively, the dimension of the major axis of the first conducive bump 120A may be less than that of the major axis of the second conductive bump 220A.

The bump pitch P2 between two adjacent second conductive bumps 220A may be greater than the bump pitch P1 of the first conductive bumps 120A. In some embodiments, the thickness 128T of the fourth conductive layer 128A of the first package component 10 is substantially equal to or greater than the thickness 228T of the fourth conductive layer 228A of the second package component 20. For example, a ratio of the thickness 128T of the fourth conductive layer 128A to the thickness 228T of the fourth conductive layer 228A is greater than 1. For example, a ratio of (128T/228T) ranges from about 1 to about 3. For example, the first conductive bump 120A has the reduced critical dimension with thicker fourth conductive layer 128A (i.e. solder-containing layer), as compared to the second conductive bump 220A. In some embodiments, the volume of the fourth conductive layer 128A of the first conductive bump 120A is substantially equal to the volume of the fourth conductive layer 228A of the corresponding second conductive bump 220A. The desired volume of the fourth conductive layers (128A and 228A) used to bond the package components (10 and 20) may be determined by the analyzed warpage characteristics of the package components (10 and 20).

Continue to FIG. 3, in subsequent process steps, one of the first conductive bumps 120A of the first package component 10 may be substantially aligned to each second conductive bump 220A of the second package component 20. After stacking, a reflow process may be performed to melt the fourth conductive layer 128A of the first package component 10 and the fourth conductive layer 228A of the second package component 20 together. In some embodiments, the reflow process is performed by heating the first package component 10/the second package component 20 to a suitable temperature for melting the fourth conductive layers (128A and 228A). For example, during the reflow process, the temperature gradually increases until it reaches the melting temperature of the fourth conductive layers (128A and 228A). In some embodiments in which the fourth conductive layers (128A and 228A) are solder-containing layers, the first package component 10/the second package component 20 may be heated to a temperature of or greater than a melting point of the fourth conductive layers (128A and 228A). For example, the temperature is elevated about 20° C. above the melting temperature of the fourth conductive layers (128A and 228A). It is noted that the reflowed temperature may vary depending on the composition content of the solder-containing layer. For example, when the fourth conductive layer 128A and/or 228A include SAC solder, the package component(s) may be heated to a higher temperature (e.g., greater than about 200° C.). In some embodiments in which the fourth conductive layer 128A and/or 228A include SnBi solder, the package components may be heated to a lower temperature (e.g., greater than about 130° C.). After the reflow, the temperature may gradually decrease, and the fourth conductive layers (128A and 228A) are combined together and allowed to cool off and solidify.

It is understood that the application of heat may cause warpage in the package components. This warpage may be caused by a difference in the coefficients of thermal expansion (CTEs) between different materials. With heating, one or both package component(s) will warp, and the distance between the two may change in an amount depending on the distance from the center of the package component and the temperature. For example, with the warpage, distances between the two package components (10 and 20) vary in different areas. The first package component 10 may have a tendency to form a convex warpage or a concave warpage. Throughout the description, when the package component is placed with the conductive bumps facing down, and the warpage causes the edges of the package component to be higher than the center of the package component, the warpage is referred to as having the concave warpage. In contrast, if the edges of the package component are lower than the center of the package component, the warpage is referred to as having the convex warpage. In some embodiments, the first package component 10 presents complex warpages rather than simple convex or simple concave warpages.

In some embodiments, the warpage characteristics of the package component(s) are analyzed prior to the bonding process. As shown in FIG. 4, the first package component 10 has warpage after the reflow process, and the warpage level across the first package component 10 may be divided in to different zones (e.g., Z1-Z5). Each zone may have a different amount of warpage. In some embodiments, the amount of warpage of the first package component 10 gradually decreases from Z1 to Z5. Alternatively, the warpage amount of the first package component 10 gradually increases from Z1 to Z5. In some embodiments, the warpage distribution is substantially concentric. It is noted that the warpage distribution divided into five zones is merely an example, and the warpage distribution may be divided into fewer zones or more than five zones. It is also understood that when the package component is heated to the higher temperature, the warpage amount of the package component is greater as compared to the package component heated to the lower temperature. For example, the warpage amount of the package component is greater than 10 μm when the package component is subjected to the higher temperature during the reflow. In some embodiments in which the first package component 10 is to be heated to the higher temperature during the reflow process, the fourth conductive layer 128A of the first conductive bumps 120A is formed to have the greater thickness 128T, as compared to the scenario that the first package component 10 is to be heated to the lower temperature. The applied amount of the fourth conductive layer 128A (i.e. the solder-containing layer) increases with resultant downward flow aided by gravity. Depending on the reflow temperature, the critical dimension of the first conductive bumps 120A and the thickness 128T of the fourth conductive layer 128A may be adjusted.

Figure 5:
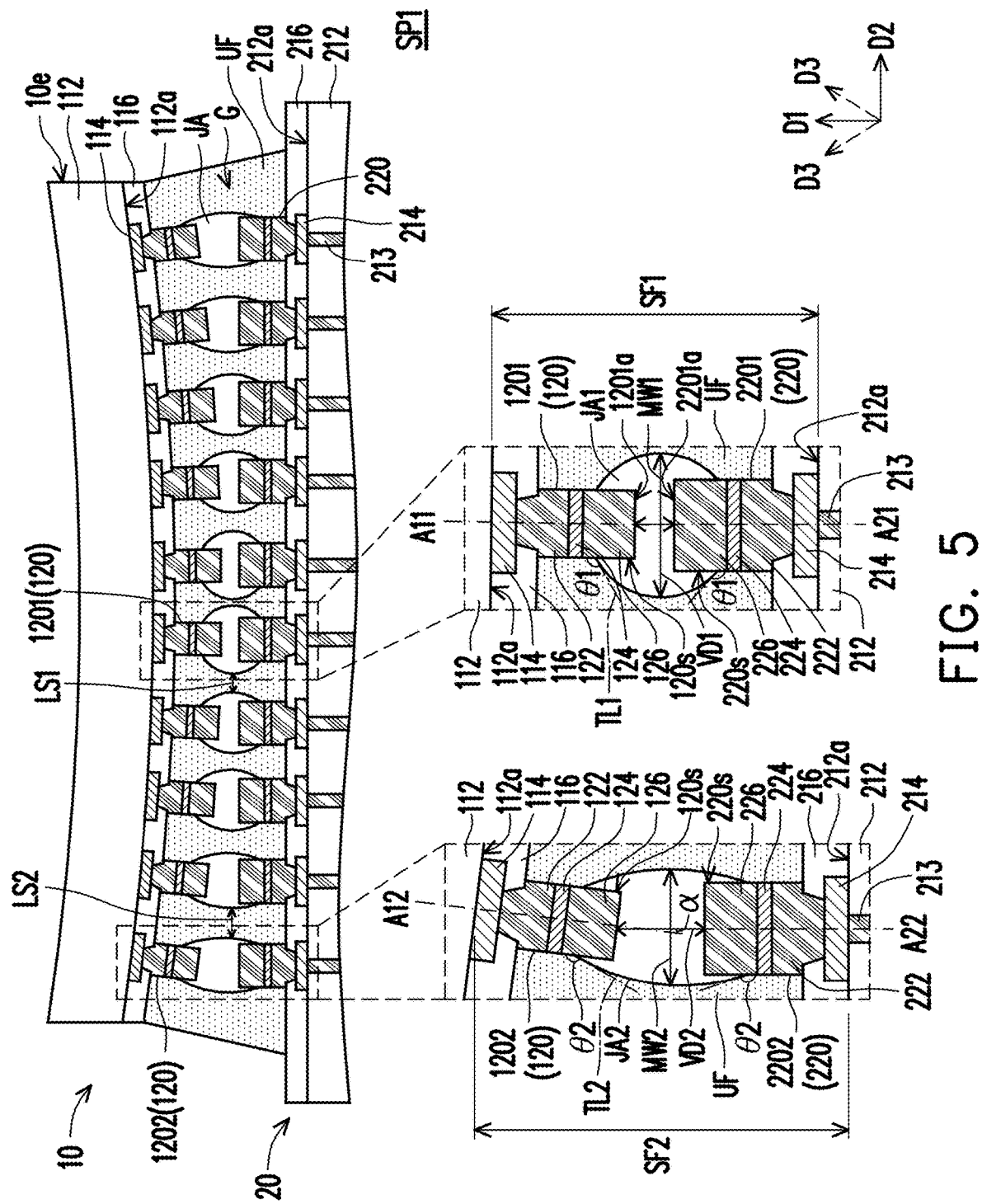
FIGS. 5-20 are schematic cross-sectional views illustrating a portion of a semiconductor package in accordance with various embodiments.

FIGS. 5-20 are schematic cross-sectional views illustrating a portion of a semiconductor package in accordance with various embodiments. Throughout the various views and illustrative embodiments of the disclosure, like reference numbers are used to designate like elements. Referring to FIG. 5 and also with reference to FIG. 3, after the reflow process, the first package component 10 is attached to the second package component 20 to form a semiconductor package SP1, and a joint structure JA connecting the first conductive bump 120 and the corresponding second conductive bump 220 is formed between the first package component 10 and the second package component 20. For example, after the reflow process, the fourth conductive layer 128A of the first package component 10 and the corresponding fourth conductive layer 228A of the second package component 20 are combined together to form the joint structure JA. The joint structure JA may be referred to as a solder joint in accordance with some embodiments. By reducing the critical dimension of the first conductive bumps 120 of the first package component 10 while keeping the same volume of the solder-containing layers (128A and 228A), interconnection defects (e.g., cold-joints and bridging) of the joint structure JA may be eliminated.

In some embodiments, after bonding the first package component 10 to the second package component 20, an underfill layer UF is formed in the gap G between the first package component 10 and the second package component 20. For example, the underfill layer UF is dispensed around the joint structure JA to provide structural support and protection to the joint structure JA. In some embodiments, the underfill layer UF climbs up to partially cover the sidewalls of the first package component 10. The underfill layer UF may be made of polymers, such as resin, epoxy, or other suitable materials. In some embodiments, the underfill layer UF includes fillers (e.g., silica) to adjust the mechanical strength. Alternatively, the underfill layer UF is omitted.

Continue to FIG. 5, the first package component 10 has a concave warpage after the reflow process. In some embodiments in which the second package component 20 has a larger size than the first package component 10, the amount of warpage of the second package component 20 may be relatively minor as compared to the warpage of the first package component 10. For example, the first package component 10 warps with the edges 10e curving upwardly, where the central region of the first package component 10 is lower than the peripheral region of the first package component 10, relative to the major surface 212a of the second package component 20. The major surface 112a of the first package component 10 may present a concave curve in the cross-sectional view, resulting in the first conductive bump 120 in the central region (also referred to the center bump 1201 in the disclosure) being lower than the first conductive bump 120 in the peripheral region (also referred to the corner bump 1202 in the disclosure).

Still referring to FIG. 5 and also with reference to FIG. 4, the first package component 10 shown in FIG. 5 may be the cross-sectional view taken along the line I-I' of FIG. 4. The amount of the warpage of the first package component 10 may be divided into different zones, and the vertical distance between the two package components (10 and 20) may vary in different zones due to the warpage. For example, the zone (e.g., Z1) within/near the central region of the first package component 10 is spaced closer to the second package component 20 than the zone (e.g., Z5) in proximity to the edges 10e of the first package component 10. The vertical distance between the first package component 10 and the second package component 20 may be referred to as the standoff of the semiconductor package SP1. The standoff may vary across the semiconductor package SP1 depending on the warpage distribution. In some embodiments, the standoff SF1 in the central region is less than the standoff SF2 in the peripheral region. In other words, the semiconductor package SP1 has the higher standoff at the peripheral region and the lower standoff at the central region.

Still referring to FIG. 5, the central axis A11 of the center bump 1201 may be substantially aligned with the central axis A21 of the center bump 2201. Due to the warpage, the central axis A12 of the corner bump 1202 and the central axis A22 of the corner bump 2202 are misaligned. For example, the central axis A12 is shifted clockwise (or counter-clockwise in accordance with some embodiments) by an angle α relative to the central axis A22. This angle α may be acute angle which depends on the amount of the warpage. The angle between the central axes (A11 and A21) may be minimal or may not exist. For example, the central axes (A11 and A21) may be substantially parallel to each other due to misalignment or formation process variations. The surfaces of the conductive bumps (120 and 220) facing each other may be viewed as the major surfaces. For example, the lateral dimension (e.g., the width) of the major surface of the first conductive bump 120 is less than that of the major surface of the corresponding second conductive bump 220. The surface area of the major surface of the first conductive bump 120 may be less than the surface area of the major surface of the corresponding second conductive bump 220. A vertical distance may be measured from the centers of the major surfaces of the conductive bumps (120 and 220). In some embodiments, the vertical distance VD1 between the center bumps (1201 and 2201) is less than the vertical distance VD2 between the corner bumps (1202 and 2202) due to the concave warpage.

Continue to FIG. 5, the center bump 1201 of the first package component 10 is coupled to the center bump 2201 of the second package component 20 through the joint structure JA1. The corner bump 1202 of the first package component 10 is coupled to the corner bump 2202 of the second package component 20 through the joint structure JA2. The joint structure JA1 is interposed between the center bumps (1201 and 2201) and may at least partially cover the third conductive layer 126 of the center bump 1201 and the third conductive layer 226 of the center bump 2201. Similarly, the joint structure JA2 is interposed between the corner bumps (1202 and 2202) and may at least partially cover the third conductive layer 126 of the corner bump 1202 and the third conductive layer 226 of the corner bump 2202. The joint structure JA may extend to cover the second conductive layers (124 and 224) or even extend to cover the first conductive layers (122 and 222) as will be described later in other embodiments.

Continue to FIG. 5, in the cross-sectional view, the width of the joint structure JA continuously increases from the endpoint of the boundary on the sidewall of the conductive bump toward the midpoint of the boundary. In some embodiments, the joint structure JA2 covering the corner bumps (1202 and 2202) has a substantially oval shape cross-section elongated along the first direction D1. The joint structure JA1 covering the center bumps (1201 and 2201) may have a substantially oval shape cross-section elongated along the second direction D2. The first direction D1 may be substantially parallel to the height or thickness direction, and the second direction D2 may be substantially parallel to the width direction. In some embodiments, the joint structure JA is elongated along the direction D3 that is not perpendicular to the second direction D2 and/or the first direction D1. The angle between the direction D3 and the second direction D2 depends on the amount of the warpage and is not limited in the disclosure.

The cross-section of the joint structure JA may vary in different zones (e.g., Z1-Z5 shown in FIG. 4). In some embodiments, in the cross-sectional view, the curvature of the outer surface of the joint structure JA1 covering the center bumps (1201 and 2201) is greater than the curvature of the outer surface of the joint structure JA2 covering the corner bumps (1202 and 2202). For example, in the cross-sectional view, the curvature of the outer surface of the respective joint structure JA on a pair of the first/second conductive bumps gradually decrease from the one covering the center bumps (1201 and 2201) toward the one covering the corner bumps (1202 and 2202). In some embodiments, a sidewall 120s of the first conductive bump 120 (or a sidewall 220s of the second conductive bump 220) and a tangent line at the end point of the boundary of the joint structure JA form an angle. For example, the angle θ1 between the sidewall (120s or 220s) of the center bump (1201 or 2201) and the tangent line TL1 at the end point of the boundary of the joint structure JA1 is less than the angle θ2 between the sidewall (120s or 220s) of the corner bump (1202 or 2202) and the tangent line TL2 at the end point of the boundary of the joint structure JA2.

Still referring to FIG. 5, a maximum width MW1 of the joint structure JA1 covering the center bumps (1201 and 2201) may be greater than a maximum width MW2 of the joint structure JA2 covering the corner bumps (1202 and 2202). The maximum width of the respective joint structure JA may vary in different zones (e.g., Z1-Z5 shown in FIG. 4). For example, the maximum width of the respective joint structure JA decreases from the one covering the center bumps (1201 and 2201) toward the one covering the corner bumps (1202 and 2202). In some embodiments, a shortest lateral distance LS1 between the joint structure JA1 and its neighboring joint structure is less than a shortest lateral distance LS2 between the joint structure JA2 and its neighboring joint structure. It is appreciated that the above description provides a general description of the features of the embodiment and that numerous other features may be present. It is also appreciated that the above description is meant only to provide a context for embodiments discussed herein and is not meant to limit the disclosure.

Figure 6:
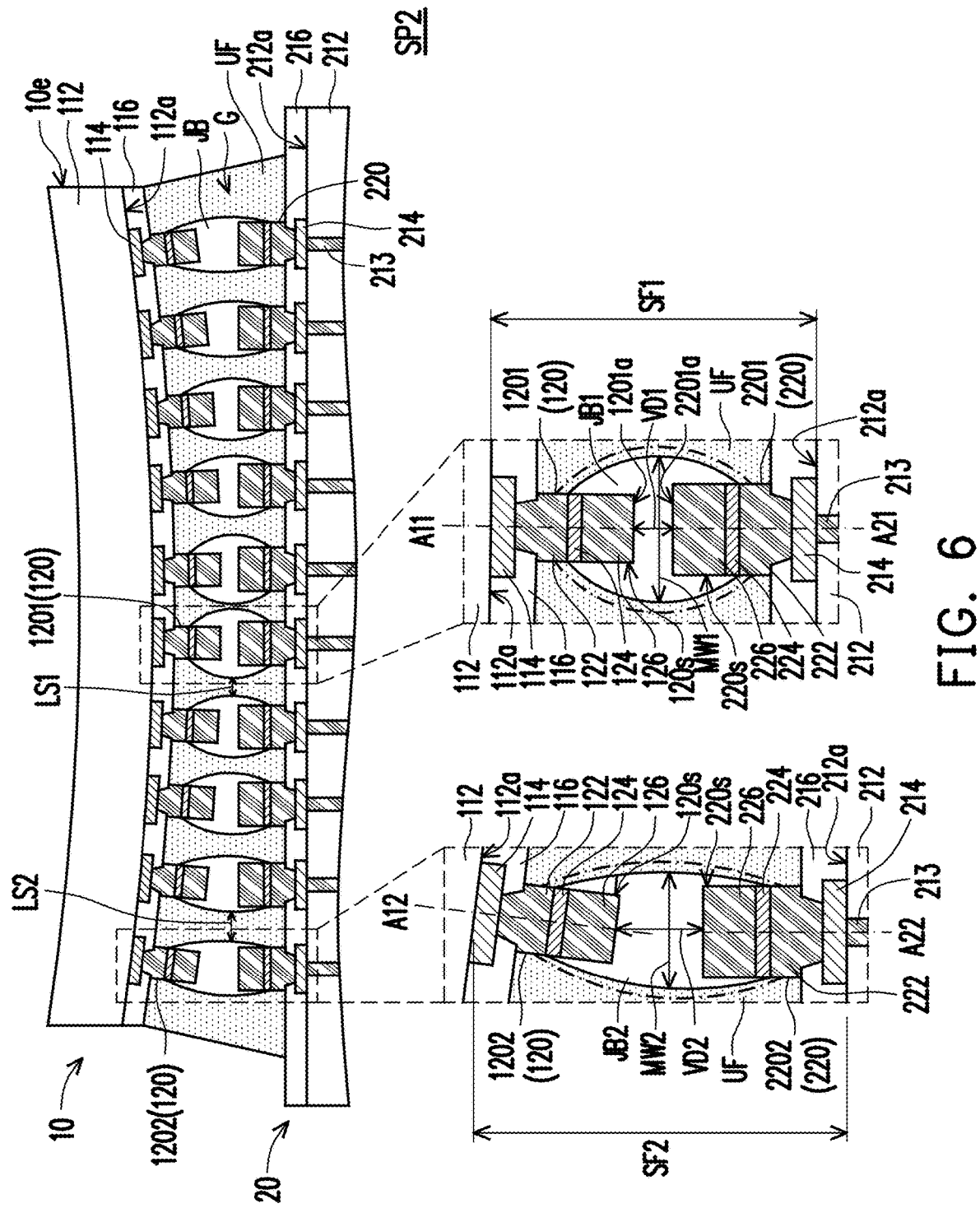

Referring to FIG. 6, a partial view of a semiconductor package SP2 is illustrated. The semiconductor package SP2 may be formed by bonding the first package component 10 to the second package component 20. In some embodiments, the analyzed warpage characteristics of the first package component 10 (along with the second package component 20 in some embodiments) are used to determine a desired critical dimension of the first conductive bump and a desired volume of solder-containing layer (e.g., the fourth conductive layer 128A shown in FIG. 3). For example, analyzing the warpage characteristics may include estimating/simulating the standoff between the two package components (10 and 20) after the bonding. In some embodiments, Moiré measurements are taken to analyze/predict the warpage of the package components. Although other method(s) may be used to analyze the warpage. During the bonding process, heating the first package component 10 and/or the second package component 20 at a predetermined temperature and for a predetermined time is performed to form the semiconductor package SP2 with the joint structure JB coupling the first conductive bump 120 and the corresponding second conductive bump 220. The semiconductor package SP2 may be formed by suitable method described in preceding paragraphs, so the details are not described herein for simplification.

Continue to FIG. 6 and also with reference to FIG. 5, the semiconductor package SP2 including the first package component 10 having the concave warpage profile may be similar to the semiconductor package SP1 described in FIG. 5. The difference therebetween includes that the joint structure JB of the semiconductor package SP2 extends along its thickness direction to at least partially cover the second conductive layer 124 of the first conductive bump 120 and/or the second conductive layer 224 of the second conductive bump 220. The extent to which the joint structure JB covers the first and second conductive bumps (120 and 220) may be determined by the thicknesses (128T and 228T) of the fourth conductive layers (128A and 228A) shown in FIG. 3. For example, when forming the fourth conductive layer 128A (shown in FIG. 1C), the greater amount of solder is plated on the third conductive layer 126, and after the reflow, the surface areas of the first conductive bump 120 and the corresponding second conductive bump 220 warped by the joint structure JB may be greater. For example, the joint structure JB not only covers the third conductive layers (126 and 226), but also covers the second conductive layers (124 and 224). In some embodiments, the joint structure further extends to cover the first conductive layers (122 and 222) as shown in the dot-dashed lines in the enlarged views.

Continue to FIG. 6, the standoff between the first package component 10 and the second package component 20 may gradually increase from the center to the edges of the semiconductor package SP2 due to the concave warpage of the first package component 10. For example, the standoff SF2 corresponding to the corner bumps (1202 and 2202) is greater than the standoff SF1 corresponding to the center bumps (1201 and 2201). In some embodiments, the first package component 10 warps with the edges 10e curving upwardly, resulting in the central axis A12 of the corner bump 1202 being offset relative to the central axis A22 of the corner bump 2202. The amount of the warpage in the central region of the first package component 10 may be minimal, resulting in the central axis A11 of the center bump 1201 being substantially aligned with the central axis A21 of the center bump 2201. In some embodiments, as a result of the concave warpage, the vertical distance between the major surfaces of the corresponding first and second conductive bumps may gradually increase from the conductive bumps located in the central region of the semiconductor package SP2 toward the conductive bumps located in the peripheral region of the semiconductor package SP2. For example, the vertical distance VD1 between the center bumps (1201 and 2201) is less than the vertical distance VD2 between the corner bumps (1202 and 2202).

Still referring to FIG. 6 and also with reference to FIG. 5, the cross-sectional view of the joint structure JB of the semiconductor package SP2 may be similar to that of the joint structure JA of the semiconductor package SP1. Thus, the detailed descriptions of the joint structure JB are simplified herein. For example, the curvature of the outer surface of the joint structure JB2 covering the corner bumps (1202 and 2202) may be less than the curvature of the outer surface of the joint structure JB1 covering the center bumps (1201 and 2201). The curvature of the outer surface of the respective joint structure JB on a pair of first and second conductive bumps may gradually increase from the one covering the corner bumps (1202 and 2202) toward the one covering the center bumps (1201 and 2201). In some embodiments, the maximum width MW2 of the joint structure JB2 covering the corner bumps (1202 and 2202) is less than the maximum width MW1 of the joint structure JB1 covering the center bumps (1201 and 2201). The maximum width of the respective joint structure JB may increase from the one covering the corner bumps (1202 and 2202) toward the one covering the center bumps (1201 and 2201). The shortest lateral distance LS2 between the joint structure JB2 and its adjacent joint structure may be greater than the shortest lateral distance LS1 between the joint structure JB1 and its adjacent joint structure.

Figure 7:
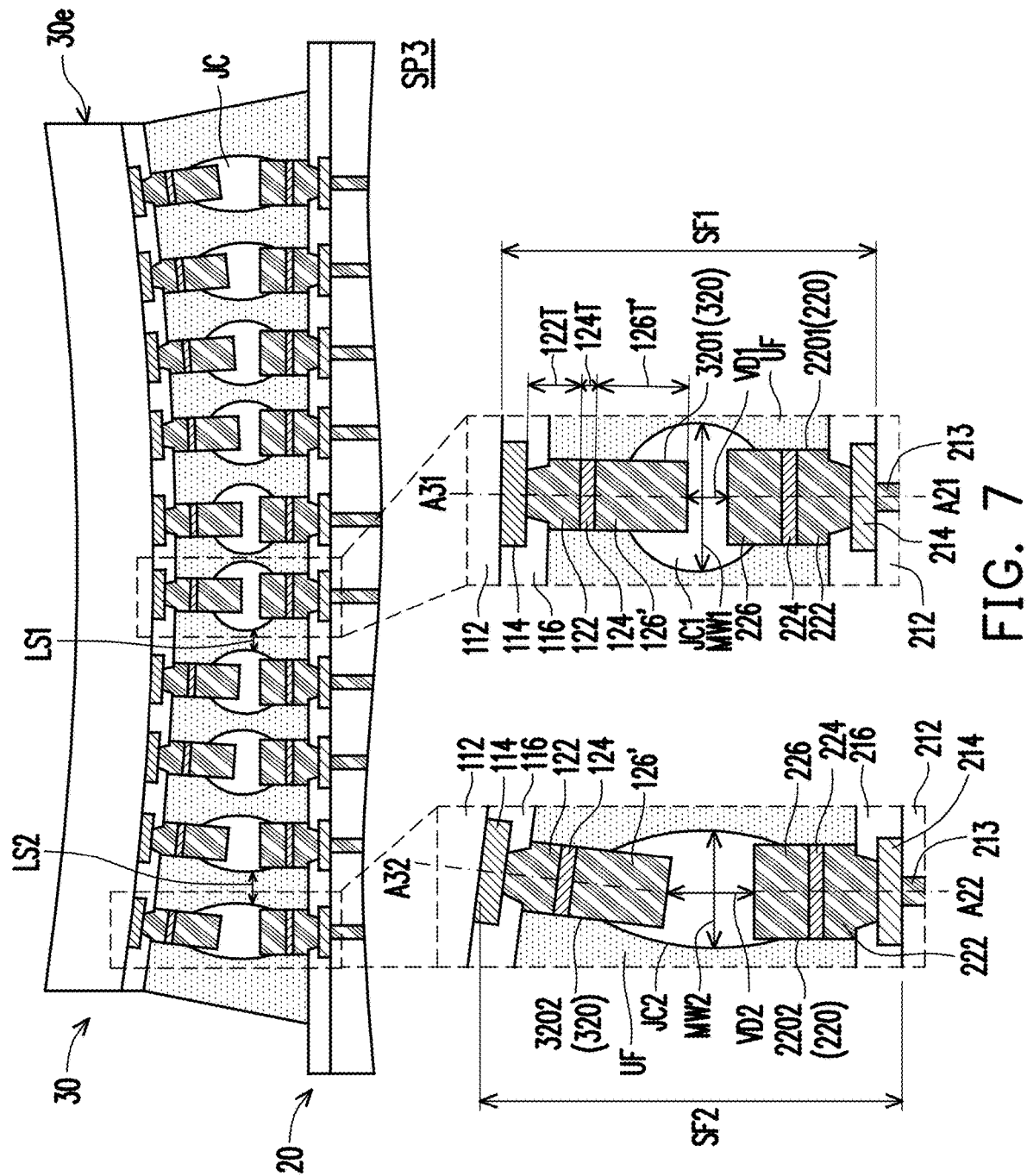

Referring to FIG. 7, a partial view of a semiconductor package SP3 is illustrated. The semiconductor package SP3 may be formed by coupling the first package component 30 to the second package component 20. The first package component 30 may be similar to the first package component 10 described above, except that the first conductive bump 320 has the third conductive layer 126' thicker than the corresponding first conductive layer 122. In other words, the respective first conductive bump 320 of the first package component 30 includes the third conductive layer 126' having the thickness 126T' greater than the thickness 122T of the first conductive layer 122. The thickness 124T of the second conductive layer 124 may be the smallest among the conductive layers of the first conductive bump 320. Alternatively, the third conductive layer 126' is a thickest layer of the first conductive bump 320 and the first conductive layer 122 is a thinnest layer of the first conductive bump 320. It is noted that the semiconductor package SP3 may be formed by the suitable method described above, so the details are not described herein.

The semiconductor package SP3 includes the first package component 30 having the concave warpage profile which is similar to the first package component 10 of the semiconductor package SP1 described in FIG. 5. The joint structure JC coupling the first conductive bump 320 to the second conductive bump 220 may be similar to the joint structure JA of the semiconductor package SP1, and thus the detailed descriptions are simplified for the sake of brevity. For example, the standoff between the first package component 30 and the second package component 20 may gradually decrease from the edges to the center of the semiconductor package SP3 due to the concave warpage of the first package component 30. In some embodiments, the standoff SF2 corresponding to the corner bumps (3202 and 2202) is greater than the standoff SF1 corresponding to the center bumps (3201 and 2201). For example, the first package component 30 warps with the edges 30e bent upwardly, resulting in the central axis A32 of the corner bump 3202 being shifted relative to the central axis A22 of the corner bump 2202. The amount of the warpage in the central region of the first package component 30 may be minimal, resulting in the central axis A31 of the center bump 3201 being substantially aligned with the central axis A21 of the center bump 2201. As a result of the concave warpage of the first package component 30, the vertical distance between the major surfaces of the corresponding first and second conductive bumps may gradually decrease from the conductive bumps located in the peripheral region of the semiconductor package SP3 toward the conductive bumps located in the central region of the semiconductor package SP3. For example, the vertical distance VD1 between the center bumps (3201 and 2201) is less than the vertical distance VD2 between the corner bumps (3202 and 2202).

Continue to FIG. 7, the cross-sectional view of the joint structure JC of the semiconductor package SP3 may be similar to that of the joint structure JA of the semiconductor package SP1 shown in FIG. 5. For example, the curvature of the outer surface of the joint structure JC1 covering the center bumps (3201 and 2201) is greater than the curvature of the outer surface of the joint structure JC2 covering the corner bumps (3202 and 2202). The curvature of the outer surface of the respective joint structure JC on a pair of the first and second conductive bumps may gradually decrease from the one covering the center bumps (3201 and 2201) toward the one covering the corner bumps (3202 and 2202). In some embodiments, the maximum width MW1 of the joint structure JC1 covering the center bumps (3201 and 2201) is greater than the maximum width MW2 of the joint structure JC2 covering the corner bumps (3202 and 2202). The maximum width of the respective joint structure JC may decrease from the one covering the center bumps (3201 and 2201) toward the one covering the corner bumps (3202 and 2202). The shortest lateral distance LS1 between the joint structure JC1 and its neighboring joint structure may be less than the shortest lateral distance LS2 between the joint structure JC2 and its neighboring joint structure.

Figure 8:
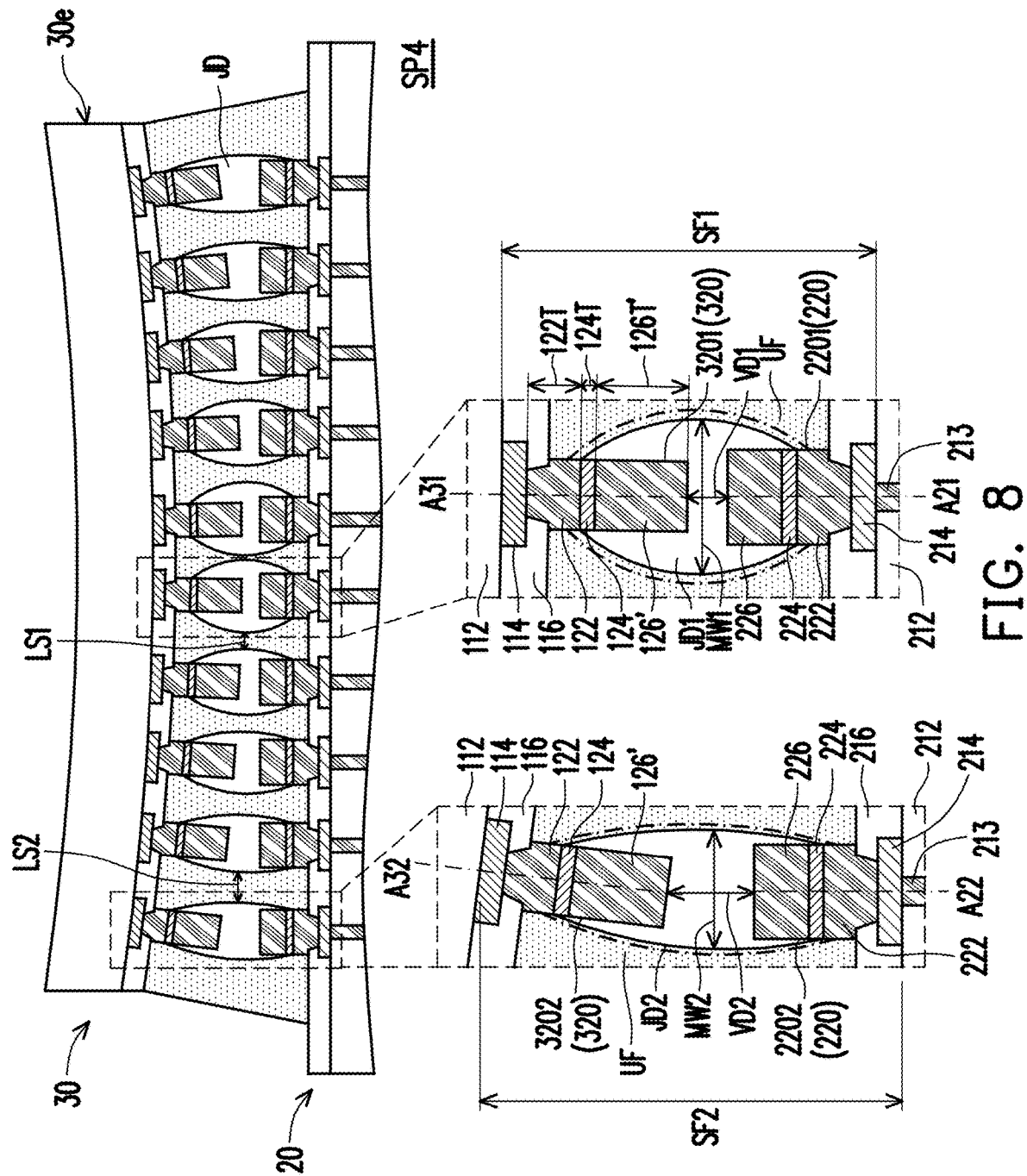

Referring to FIG. 8, a partial view of a semiconductor package SP4 is illustrated. The semiconductor package SP4 may be similar to the semiconductor package SP3 described in FIG. 7, except that the joint structure JD covers the third conductive layers (126' and 226) and further extends along the thickness direction to at least cover the second conductive layer(s) (124 and/or 224). In some embodiments, the joint structure further extends along the thickness direction to at least partially cover the first conductive layer(s) (122 and/or 222) as shown in the dot-dashed lines in the enlarged views. The extent to which the joint structure JD covers the first and second conductive bumps (320 and 220) may be determined by the thicknesses (128T and 228T) of the fourth conductive layers (128A and 228A) as described previously. The joint structure JD of the semiconductor package SP4 coupling the first conductive bump 320 and the second conductive bump 220 may be similar to that of the joint structure JC of the semiconductor package SP3 shown in FIG. 7. Thus, the detailed descriptions of the joint structure JD are simplified herein.

Continue to FIG. 8, the standoff between the first package component 30 and the second package component 20 may gradually increase from the center to the edges of the semiconductor package SP4 due to the concave warpage of the first package component 30. The standoff SF2 corresponding to the corner bumps (3202 and 2202) may be greater than the standoff SF1 corresponding to the center bumps (3201 and 2201). With the concave warpage of the first package component 30, the vertical distance between the major surfaces of the corresponding first and second conductive bumps may gradually increase from a pair of first and second conductive bumps located in the central region of the semiconductor package SP4 toward a pair of first and second conductive bumps located in the peripheral region of the semiconductor package SP4. For example, the vertical distance VD2 between the corner bumps (3202 and 2202) is greater than the vertical distance VD1 between the center bumps (3201 and 2201).

Still referring to FIG. 8, the cross-sectional view of the joint structure JD of the semiconductor package SP4 may be similar to that of the joint structure JA of the semiconductor package SP1 described in FIG. 5. For example, the curvature of the outer surface of the joint structure JD2 covering the corner bumps (3202 and 2202) is less than the curvature of the outer surface of the joint structure JD1 covering the center bumps (3201 and 2201). The curvature of the outer surface of the respective joint structure JD on a pair of the first and second conductive bumps (320 and 220) may gradually increase from the one covering the corner bumps (3202 and 2202) toward the one covering the center bumps (3201 and 2201). In some embodiments, the maximum width MW2 of the joint structure JD2 covering the corner bumps (3202 and 2202) is less than the maximum width MW1 of the joint structure JD1 covering the center bumps (3201 and 2201). The maximum width of the respective joint structure JD on a pair of the first and second conductive bumps (320 and 220) may increase from the one covering the corner bumps (3202 and 2202) toward the one covering the center bumps (3201 and 2201). The shortest lateral distance LS2 between the joint structure JD2 and its neighboring joint structure may be greater than the shortest lateral distance LS1 between the joint structure JD1 and its neighboring joint structure.

Figure 9:
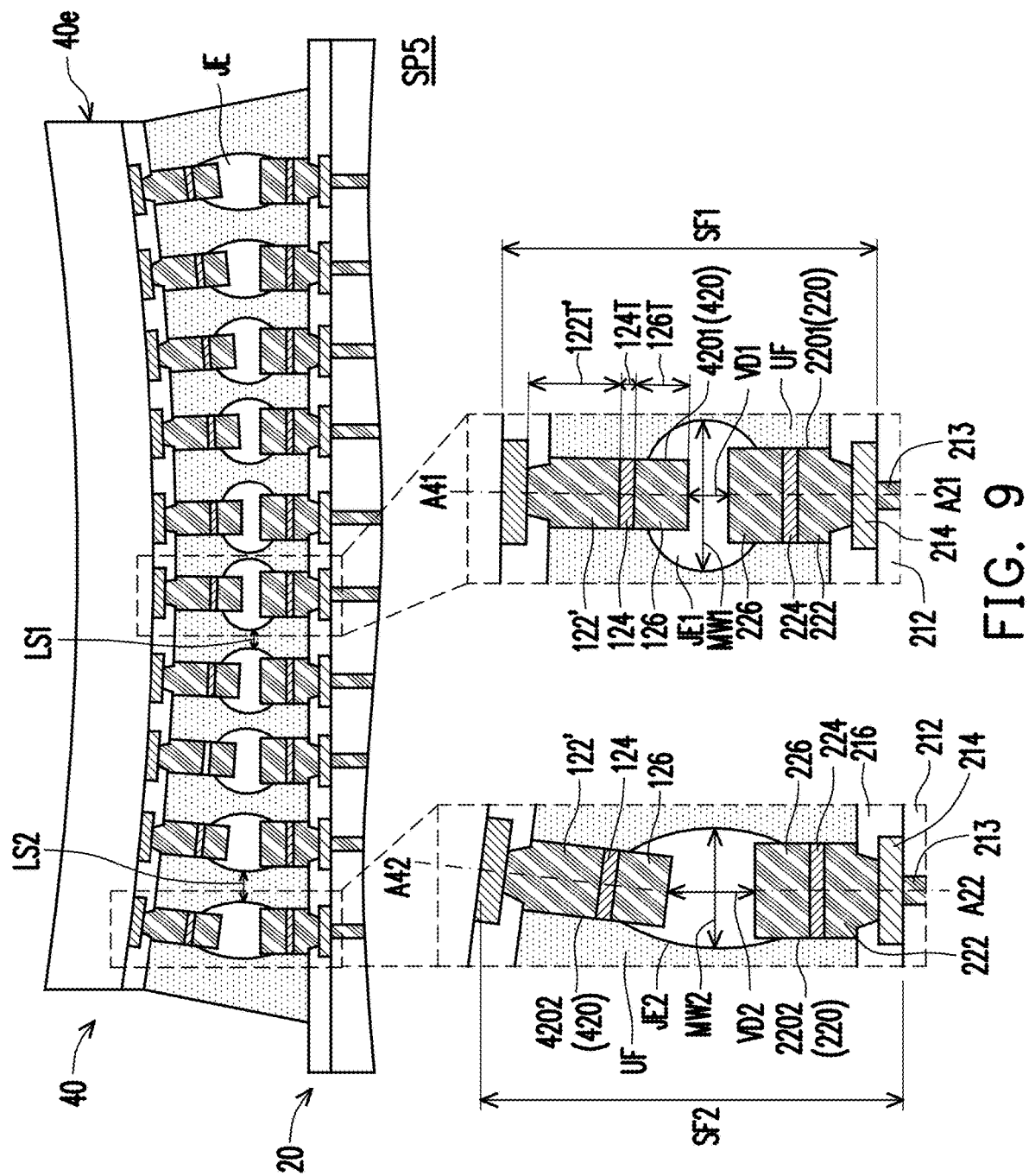

Referring to FIG. 9, a partial view of a semiconductor package SP5 is illustrated. The semiconductor package SP5 may be formed by coupling the first package component 40 to the second package component 20. The first package component 40 may be similar to the first package component 10 described above, except that the first conductive bump 420 has the first conductive layer 122' thicker than the corresponding third conductive layer 126. In other words, the respective first conductive bump 420 of the first package component 40 includes the first conductive layer 122' having the thickness 122T' greater than the thickness 126T of the third conductive layer 126. The thickness 124T of the second conductive layer 124 may be the smallest among the conductive layers of the first conductive bump 420. Alternatively, the first conductive layer 122' is a thickest layer of the first conductive bump 420 and the third conductive layer 126 is a thinnest layer of the first conductive bump 420. It is noted that the semiconductor package SP5 may be formed by the suitable method described above, so the details are not described herein.

Continue to FIG. 9, the semiconductor package SP5 includes the first package component 40 having the concave warpage profile which is similar to the first package component 10 of the semiconductor package SP1 described in FIG. 5. The joint structure JE of the semiconductor package SP5 coupling the first conductive bump 420 to the second conductive bump 220 may also be similar to the joint structure JA of the semiconductor package SP1, so the detailed descriptions are simplified for the sake of brevity. For example, the standoff between the first package component 40 and the second package component 20 gradually increases from the center to edges of the semiconductor package SP5 due to the concave warpage of the first package component 40. With the concave warpage, the standoff SF2 corresponding to the corner bumps (4202 and 2202) may be greater than the standoff SF1 corresponding to the center bumps (4201 and 2201). For example, the first package component 40 warps with the edges 40e bent upwardly, resulting in the central axis A42 of the corner bump 4202 being offset relative to the central axis A22 of the corner bump 2202. The amount of the warpage in the central region of the first package component 40 may be minimal, resulting in the central axis A41 of the center bump 1201 being substantially aligned with the central axis A21 of the center bump 2201. With the concave warpage of the first package component 40, the vertical distance between the major surfaces of the corresponding first and second conductive bumps (420 and 220) may gradually increase from the corresponding first and second conductive bumps located in the central region of the semiconductor package SP5 toward the corresponding first and second conductive bumps located in the peripheral region of the semiconductor package SP5. For example, the vertical distance VD2 between the corner bumps (4202 and 2202) is greater than the vertical distance VD1 between the center bumps (4201 and 2201).

Still referring to FIG. 9, the cross-sectional view of the joint structure JE of the semiconductor package SP5 may be similar to that of the joint structure JA of the semiconductor package SP1 shown in FIG. 5. For example, the curvature of the outer surface of the joint structure JE2 covering the corner bumps (4202 and 2202) is less than the curvature of the outer surface of the joint structure JE1 covering the center bumps (4201 and 2201). The curvature of the outer surface of the respective joint structure JE on a pair of the first and second conductive bumps may gradually increase from the one covering the corner bumps (4202 and 2202) toward the one covering the center bumps (4201 and 2201). In some embodiments, the maximum width MW2 of the joint structure JE2 covering the corner bumps (4202 and 2202) is less than the maximum width MW1 of the joint structure JE1 covering the center bumps (4201 and 2201). The maximum width of the respective joint structure JE may increase from the one covering the corner bumps (4202 and 2202) toward the one covering the center bumps (4201 and 2201). The shortest lateral distance LS2 between the joint structure JE2 and its neighboring joint structure may be greater than the shortest lateral distance LS1 between the joint structure JE1 and its neighboring joint structure.

Figure 10:
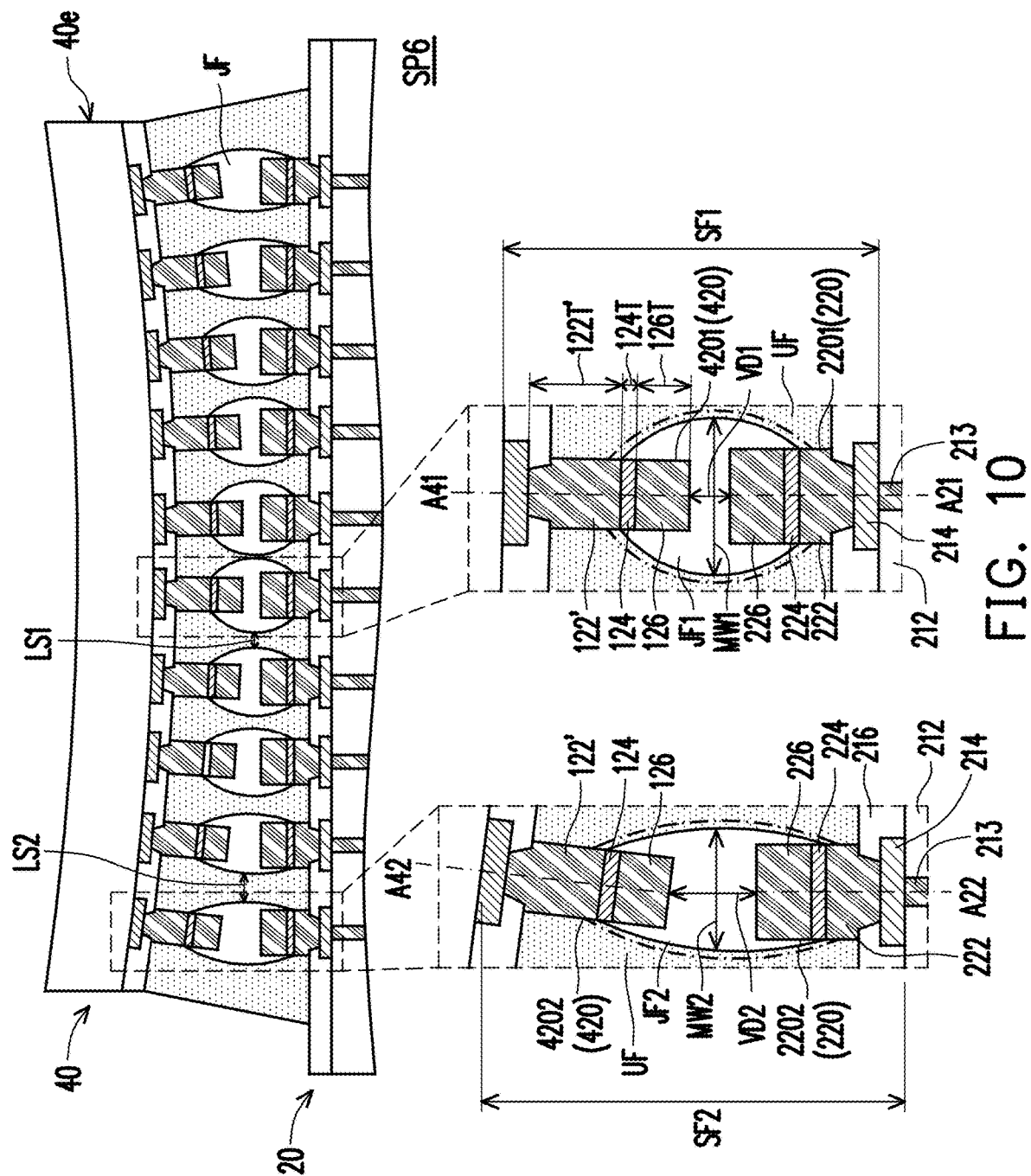

Referring to FIG. 10, a partial view of a semiconductor package SP6 is illustrated. The semiconductor package SP6 may be similar to the semiconductor package SP5 described in FIG. 9, except that the joint structure JF covers the third conductive layers (126 and 226) and further extends along the thickness direction to at least cover the second conductive layer(s) (124 and/or 224). In some embodiments, the joint structure further extends along the thickness direction to at least partially cover the first conductive layer(s) (122' and/or 222) as shown in the dot-dashed lines in the enlarged views. The extent to which the joint structure JF covers the corresponding first and second conductive bumps (420 and 220) may be determined by the thicknesses (128T and 228T) of the fourth conductive layers (128A and 228A) as described above in FIG. 6. The joint structure JF of the semiconductor package SP6 coupling the first conductive bump 420 and the second conductive bump 220 may be similar to that of the joint structure JE of the semiconductor package SP5 shown in FIG. 9, so the detailed descriptions of the joint structure JF are simplified herein.

Continue to FIG. 10, the standoff between the first package component 40 and the second package component 20 may gradually decrease from the edges to the center of the semiconductor package SP6 due to the concave warpage of the first package component 40. The standoff SF2 corresponding to the corner bumps (4202 and 2202) may be greater than the standoff SF1 corresponding to the center bumps (4201 and 2201). As a result of the concave warpage of the first package component 40, the vertical distance between the major surfaces of the corresponding first and second conductive bumps may gradually decrease from a pair of the first and second conductive bumps located in the peripheral region of the semiconductor package SP6 toward a pair of the first and second conductive bumps located in the central region of the semiconductor package SP6. For example, the vertical distance VD1 between the center bumps (4201 and 2201) is less than the vertical distance VD2 between the corner bumps (4202 and 2202).

Still referring to FIG. 10, the cross-sectional view of the joint structure JF of the semiconductor package SP6 may be similar to that of the joint structure JA of the semiconductor package SP1 described in FIG. 5. For example, the curvature of the outer surface of the joint structure JF1 covering the center bumps (4201 and 2201) is greater than the curvature of the outer surface of the joint structure JF2 covering the corner bumps (4202 and 2202). The curvature of the outer surface of the respective joint structure JF on a pair of the first and second conductive bumps may gradually decrease from the one covering the center bumps (4201 and 2201) toward the one covering the corner bumps (4202 and 2202). In some embodiments, the maximum width MW1 of the joint structure JF1 covering the center bumps (4201 and 2201) is greater than the maximum width MW2 of the joint structure JF2 covering the corner bumps (4202 and 2202). The maximum width of the respective joint structure JF may decrease from the one covering the center bumps (4201 and 2201) toward the one covering the corner bumps (4202 and 2202). The shortest lateral distance LS1 between the joint structure JF1 and its neighboring joint structure may be less than shortest lateral distance LS2 between the joint structure JF2 and its neighboring joint structure.

Figure 11:
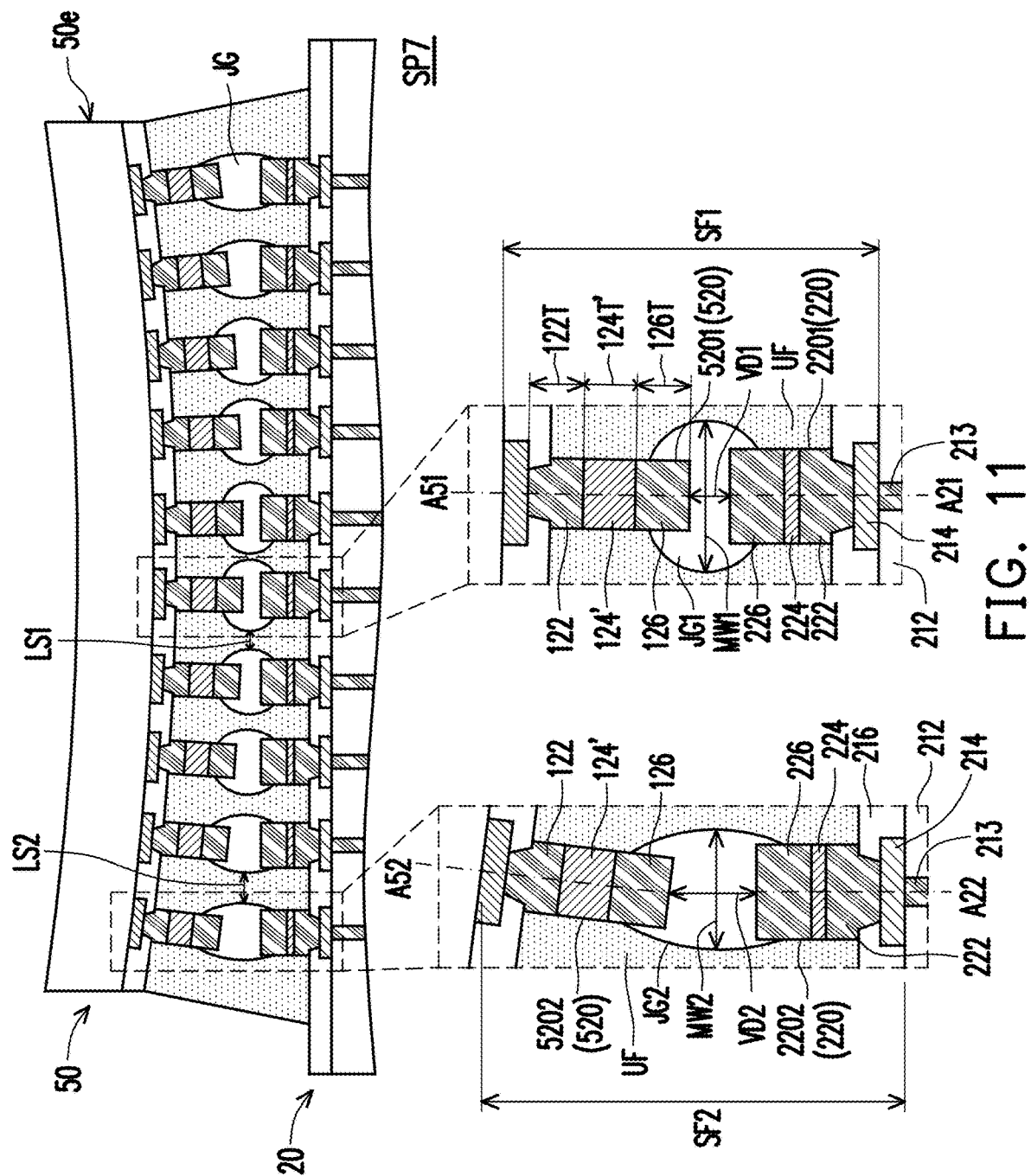

Referring to FIG. 11, a partial view of a semiconductor package SP7 is illustrated. The semiconductor package SP7 may be formed by coupling the first package component 50 to the second package component 20. The first package component 50 may be similar to the first package component 10 described above, except that the first conductive bump 520 has the second conductive layer 124' thicker than the corresponding first conductive layer 122 and/or the corresponding third conductive layer 126. In other words, the respective first conductive bump 520 of the first package component 50 includes the second conductive layer 124' having the thickness 124T' greater than the thickness 122T of the first conductive layer 122 and/or the thickness 126T of the third conductive layer 126. The second conductive layer 124' may be a thickest layer among the conductive layers of the first conductive bump 520. In some embodiments, the second conductive layer 124' is thicker than the first conductive layer 122 which may be of the same thickness as the third conductive layer 126. In some embodiments, the second conductive layer 124' is thicker than the first conductive layer 122, while the first conductive layer 122 is thicker than or thinner than the third conductive layer 126. It is noted that the semiconductor package SP7 may be formed by the suitable method described above, so the details are not described herein.

Continue to FIG. 11, the semiconductor package SP7 includes the first package component 50 having the concave warpage profile which is similar to the first package component 10 of the semiconductor package SP1 described in FIG. 5. The joint structure JG coupling the first conductive bump 520 to the second conductive bump 220 may also be similar to the joint structure JA of the semiconductor package SP1, and thus the detailed descriptions are simplified for the sake of brevity. For example, the standoff between the first package component 50 and the second package component 20 may gradually increase from the center to edges of the semiconductor package SP7 due to the concave warpage of the first package component 50. With the concave warpage, the standoff SF2 corresponding to the corner bumps (5202 and 2202) may be greater than the standoff SF1 corresponding to the center bumps (5201 and 2201). For example, the first package component 50 warps with the edges 50e curving upwardly, resulting in the central axis A52 of the corner bump 5202 being shifted relative to the central axis A22 of the corner bump 2202. The amount of the warpage in the central region of the first package component 50 may be minimal, resulting in the central axis A51 of the center bump 5201 being substantially aligned with the central axis A21 of the center bump 2201. As a result of the concave warpage of the first package component 50, the vertical distance between the major surfaces of the corresponding first and second conductive bumps (520 and 220) may gradually increase from a pair of the first and second conductive bumps located in the central region of the semiconductor package SP7 toward a pair of the first and second conductive bumps located in the peripheral region of the semiconductor package SP7. For example, the vertical distance VD2 between the corner bumps (5202 and 2202) is greater than the vertical distance VD1 between the center bumps (5201 and 2201).

Still referring to FIG. 11, the cross-sectional view of the joint structure JG of the semiconductor package SP7 may be similar to that of the joint structure JA of the semiconductor package SP1. For example, the curvature of the outer surface of the joint structure JG2 covering the corner bumps (5202 and 2202) is less than the curvature of the outer surface of the joint structure JG1 covering the center bumps (5201 and 2201). The curvature of the outer surface of the respective joint structure JG on a pair of the first and second conductive bumps may gradually increase from the one covering the corner bumps (5202 and 2202) toward the one covering the center bumps (5201 and 2201). In some embodiments, the maximum width MW2 of the joint structure JG2 covering the corner bumps (5202 and 2202) is less than the maximum width MW1 of the joint structure JG1 covering the center bumps (5201 and 2201). The maximum width of the respective joint structure JG may increase from the one covering the corner bumps (5202 and 2202) toward the one covering the center bumps (5201 and 2201). The shortest lateral distance LS2 between the joint structure JG2 and its neighboring joint structure may be greater than the shortest lateral distance LS1 between the joint structure JG1 and its neighboring joint structure.

Figure 12:
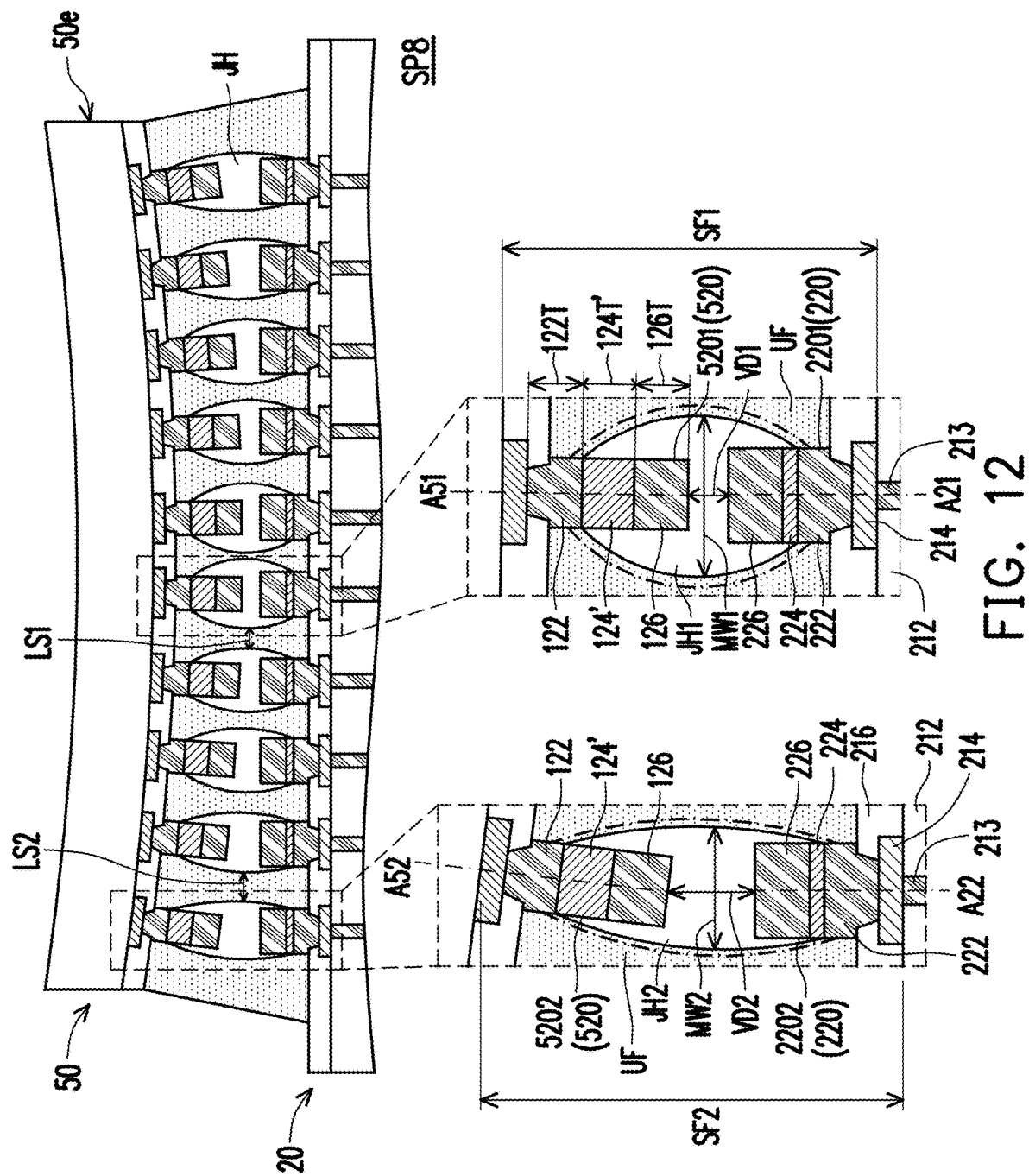

Referring to FIG. 12, a partial view of a semiconductor package SP8 is illustrated. The semiconductor package SP8 may be similar to the semiconductor package SP7 described in FIG. 11, except that the joint structure JH covers the third conductive layers (126 and 226) and further extends along the thickness direction to at least cover the second conductive layer(s) (124' and/or 224). In some embodiments, the joint structure further extends along the thickness direction to at least partially cover the first conductive layer(s) (122 and/or 222) as shown in the dot-dashed lines in the enlarged views. The extent to which the joint structure JH covers a pair of the first and second conductive bumps (520 and 220) may be determined by the thicknesses (128T and 228T) of the fourth conductive layers (128A and 228A) as described in FIG. 6.

Continue to FIG. 12, the joint structure JH of the semiconductor package SP8 coupling the first conductive bump 520 and the second conductive bump 220 may be similar to that of the joint structure JG of the semiconductor package SP7. Thus, the detailed descriptions of the joint structure JH are simplified herein. For example, the standoff between the first package component 50 and the second package component 20 may gradually decrease from the edges to the center of the semiconductor package SP8 due to the concave warpage of the first package component 50. As a result of the concave warpage of the first package component 50, the vertical distance between the major surfaces of the corresponding first and second conductive bumps may gradually decrease from a pair of the first and second conductive bumps (520 and 220) located in the peripheral region of the semiconductor package SP8 toward a pair of the first and second conductive bumps (520 and 220) located in the central region of the semiconductor package SP8. For example, the vertical distance VD1 between the center bumps (5201 and 2201) is less than the vertical distance VD2 between the corner bumps (5202 and 2202).

Still referring to FIG. 12, the cross-sectional view of the joint structure JH of the semiconductor package SP8 may be similar to that of the joint structure JA of the semiconductor package SP1 described in FIG. 5. For example, the curvature of the outer surface of the joint structure JH1 covering the center bumps (5201 and 2201) is greater than the curvature of the outer surface of the joint structure JH2 covering the corner bumps (5202 and 2202). The curvature of the outer surface of the respective joint structure JH on a pair of the first and second conductive bumps may gradually decrease from the one covering the center bumps (5201 and 2201) toward the one covering the corner bumps (5202 and 2202). In some embodiments, the maximum width MW1 of the joint structure JH1 covering the center bumps (5201 and 2201) is greater than the maximum width MW2 of the joint structure JH2 covering the corner bumps (5202 and 2202). The maximum width of the respective joint structure JH may decrease from the one covering the center bumps (5201 and 2201) toward the one covering the corner bumps (5202 and 2202). The shortest lateral distance LS1 between the joint structure JH1 and its neighboring joint structure may be less than shortest lateral distance LS2 between the joint structure JH2 and its neighboring joint structure.

Figure 13:
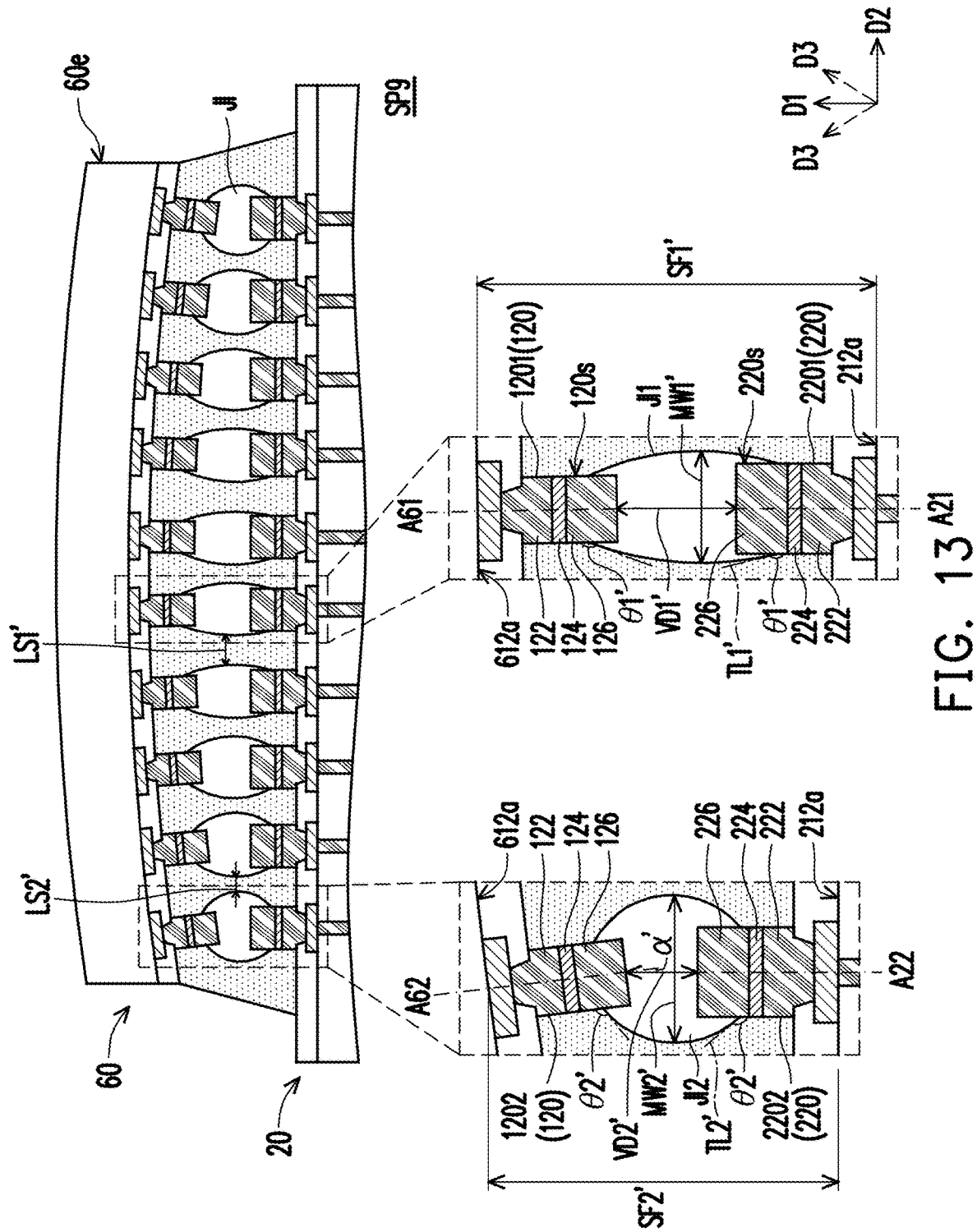

Referring to FIG. 13, a partial view of a semiconductor package SP9 is illustrated. The semiconductor package SP9 may be formed by coupling the first package component 60 to the second package component 20. The first package component 60 may be similar to the first package component 10 described above, except that the first package component 60 has a convex warpage profile after the reflow process. For example, the first package component 60 warps with the edges 60e curving downwardly, where the central region of the first package component 60 is higher than the peripheral region of the first package component 60, relative to the major surface 212a of the second package component 20. The major surface 612a of the first package component 60 may present a convex curve in the cross-sectional view, resulting in the corner bump 1202 being lower than the center bump 1201. The amount of the warpage of the first package component 60 may be divided into various zones, and the vertical distance between the two package components (60 and 20) may vary in different zones. For example, the zone in proximity to the edges 60e of the first package component 60 is spaced closer to the second package component 20 than the zone within/near the central region of the first package component 60. The semiconductor package SP9 may have the higher standoff at the central region and the lower standoff at the peripheral region. For example, the standoff SF1' corresponding to the center bumps (1201 and 2201) is greater than the standoff SF2' corresponding to the corner bumps (1202 and 2202).

Continue to FIG. 13, the central axis A62 of the corner bump 1202 may be shifted counter-clockwise (or clockwise in accordance with some embodiments) by an angle α' relative to the central axis A22 of the corresponding corner bump 2202. This angle α' may be acute angle which depends on the amount of the warpage. The angle between the central axes (A61 and A21) may be minimal or may not exist. For example, the central axes (A61 and A21) may be substantially parallel to each other due to misalignment causing by the warpage or formation process variations. In some embodiments, the vertical distance VD1' between the center bumps (1201 and 2201) is greater than the vertical distance VD2' between the corner bumps (1202 and 2202) due to the convex warpage. The first conductive bump 120 of the first package component 60 may be coupled to the corresponding second conductive bump 220 of the second package component 20 through the joint structure JI. For example, the joint structure JI1 is interposed between the center bumps (1201 and 2201) and may at least partially cover the third conductive layers 126 of the center bump 1201 and the third conductive layer 226 of the center bump 2201. Similarly, the joint structure JI2 is interposed between the corner bumps (1202 and 2202) and may at least partially cover the third conductive layer 126 of the corner bump 1202 and the third conductive layer 226 of the corner bump 2202. The joint structure JI may extend to cover the second conductive layers (124 and 224) or even extend to cover the first conductive layers (122 and 222) if the sufficient amount of solder is applied.

Still referring to FIG. 13, the cross-section of the joint structure JI may vary in different zones (e.g., Z1-Z5 shown in FIG. 4). The width of the joint structure JI may continuously increase from the endpoint of the boundary on the sidewall of the conductive bump toward the midpoint of the boundary as shown in the cross-sectional view. In some embodiments, the joint structure JI1 covering the center bumps (1201 and 2201) may have a substantially oval shape cross-section elongated along the first direction D1 (e.g., the thickness or height direction). The joint structure JI2 covering the corner bumps (1202 and 2202) has a substantially oval shape cross-section elongated along the second direction D2 (e.g., the width direction). Alternatively, the joint structure JI is elongated along the direction D3 that is not perpendicular to the first and/or second direction. In some embodiments, in the cross-sectional view, the curvature of the outer surface of the joint structure JI1 covering the center bumps (1201 and 2201) is less than the curvature of the outer surface of the joint structure JI2 covering the corner bumps (1202 and 2202). For example, the curvature of the outer surface of the respective joint structure JI on a pair of first/second conductive bumps gradually increases from the one covering the center bumps (1201 and 2201) toward the one covering the corner bumps (1202 and 2202).

In some embodiments, the sidewall 120s of the first conductive bump 120 (or the sidewall 220s of the second conductive bump 220) and the tangent line at the end point of the boundary of the joint structure JI form an angle. For example, the angle θ1' between the sidewall (120s or 220s) of the center bump (1201 or 2201) and the tangent line TL1' at the end point of the boundary of the joint structure JI1 is greater than the angle θ2' between the sidewall (120s or 220s) of the corner bump (1202 or 2202) and the tangent line TL2' at the end point of the boundary of the joint structure JI2. In some embodiments, a maximum width MW1' of the joint structure JI1 covering the center bumps (1201 and 2201) is less than a maximum width MW2' of the joint structure JI2 covering the corner bumps (1202 and 2202). The maximum width of the respective joint structure JI may increase from the one covering the center bumps (1201 and 2201) toward the one covering the corner bumps (1202 and 2202). In some embodiments, a shortest lateral distance LS1' between the joint structure JI1 and its neighboring joint structure is greater than a shortest lateral distance LS2' between the joint structure JI2 and its neighboring joint structure.

Figure 14:
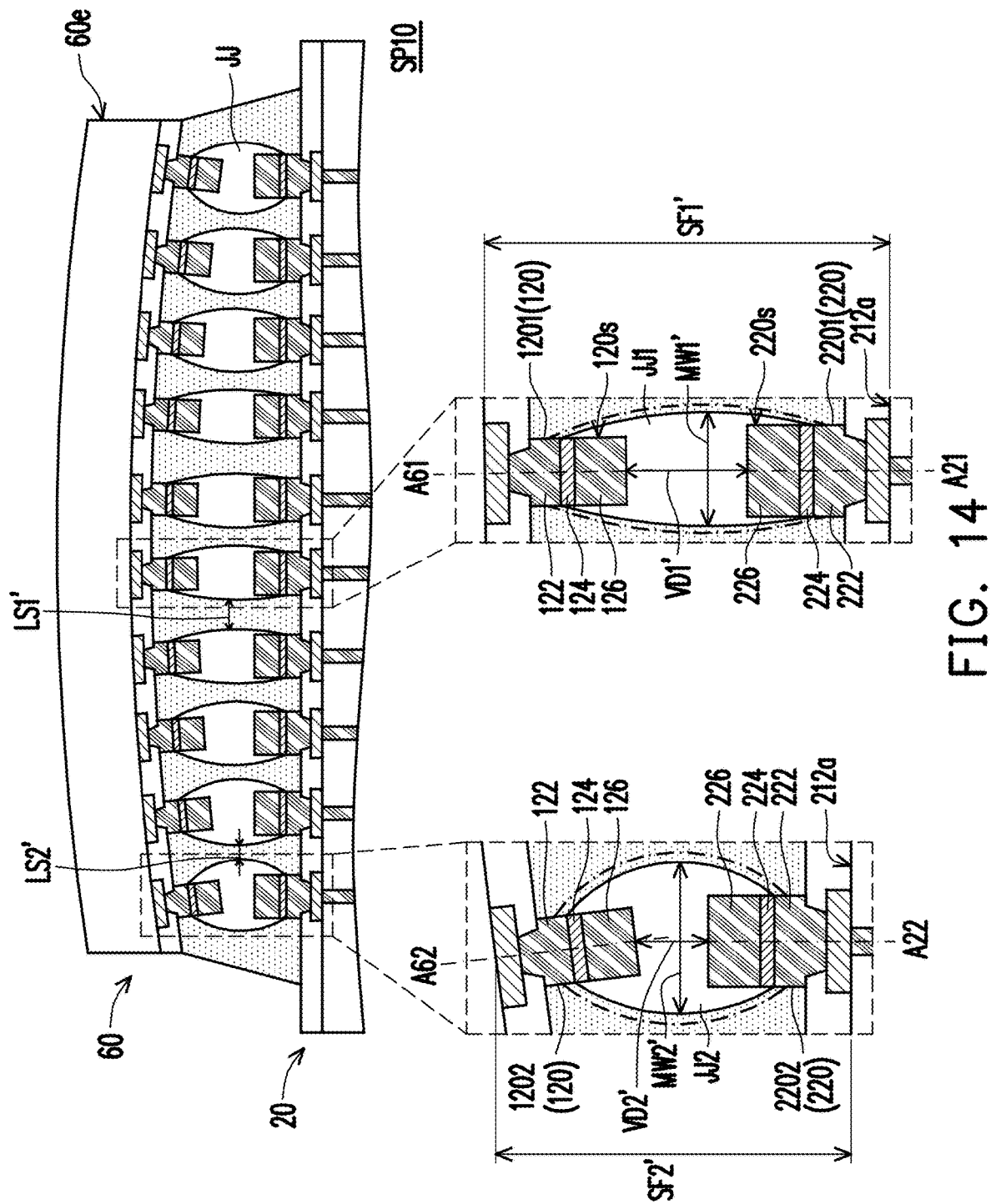

Referring to FIG. 14, a partial view of a semiconductor package SP10 is illustrated. The semiconductor package SP10 may be formed by bonding the first package component 60 to the second package component 20. The first package component 60 may have the concave warpage profile similar to the first package component 60 of the semiconductor package SP9 described in FIG. 13, except that the joint structure JJ coupling the first conductive bumps 120 and the second conductive bumps 220 may extend along the thickness direction to at least partially cover the second conductive layer 124 of the first conductive bump 120 and/or the second conductive layer 224 of the second conductive bump 220. Again, the extent to which the joint structure JJ covers the corresponding first and second conductive bumps (120 and 220) may be determined by the thicknesses (128T and 228T) of the fourth conductive layers (128A and 228A) shown in FIG. 3.

Continue to FIG. 14, the standoff SF2' corresponding to the corner bumps (1202 and 2202) may be less than the standoff SF1' corresponding to the center bumps (1201 and 2201). The standoff between the first package component 60 and the second package component 20 may gradually increase from the edges to the center of the semiconductor package SP10 due to the convex warpage of the first package component 60. The first package component 60 warps with the edges 60e bent downwardly, resulting in the central axis A62 of the corner bump 1202 being offset relative to the central axis A22 of the corner bump 2202. In some embodiments, as a result of the convex warpage, the vertical distance between the major surfaces of the corresponding first and second conductive bumps (120 and 220) gradually decreases from a pair of the first and second conductive bumps located in the central region of the semiconductor package SP10 toward a pair of the first and second conductive bumps located in the peripheral region of the semiconductor package SP10. For example, the vertical distance VD2' between the corner bumps (1202 and 2202) is less than the vertical distance VD1' between the center bumps (1201 and 2201).

Still referring to FIG. 14, the cross-sectional view of the joint structure JJ of the semiconductor package SP10 may be similar to that of the joint structure JI of the semiconductor package SP9 shown in FIG. 13, so the detailed descriptions of the joint structure JJ are simplified herein. For example, the curvature of the outer surface of the joint structure JJ2 covering the corner bumps (1202 and 2202) may be greater than the curvature of the outer surface of the joint structure JJ1 covering the center bumps (1201 and 2201). The curvature of the outer surface of the respective joint structure JJ on a pair of the first and second conductive bumps (120 and 220) may gradually decrease from the one covering the corner bumps (1202 and 2202) toward the one covering the center bumps (1201 and 2201). In some embodiments, the maximum width MW2' of the joint structure JJ2 covering the corner bumps (1202 and 2202) is greater than the maximum width MW1' of the joint structure JJ1 covering the center bumps (1201 and 2201). The maximum width of the respective joint structure JJ may decrease from the one covering the corner bumps (1202 and 2202) toward the one covering the center bumps (1201 and 2201). The shortest lateral distance LS2' between the joint structure JJ2 and its neighboring joint structure may be less than the shortest lateral distance LS1' between the joint structure JJ1 and its neighboring joint structure.

Figure 15:
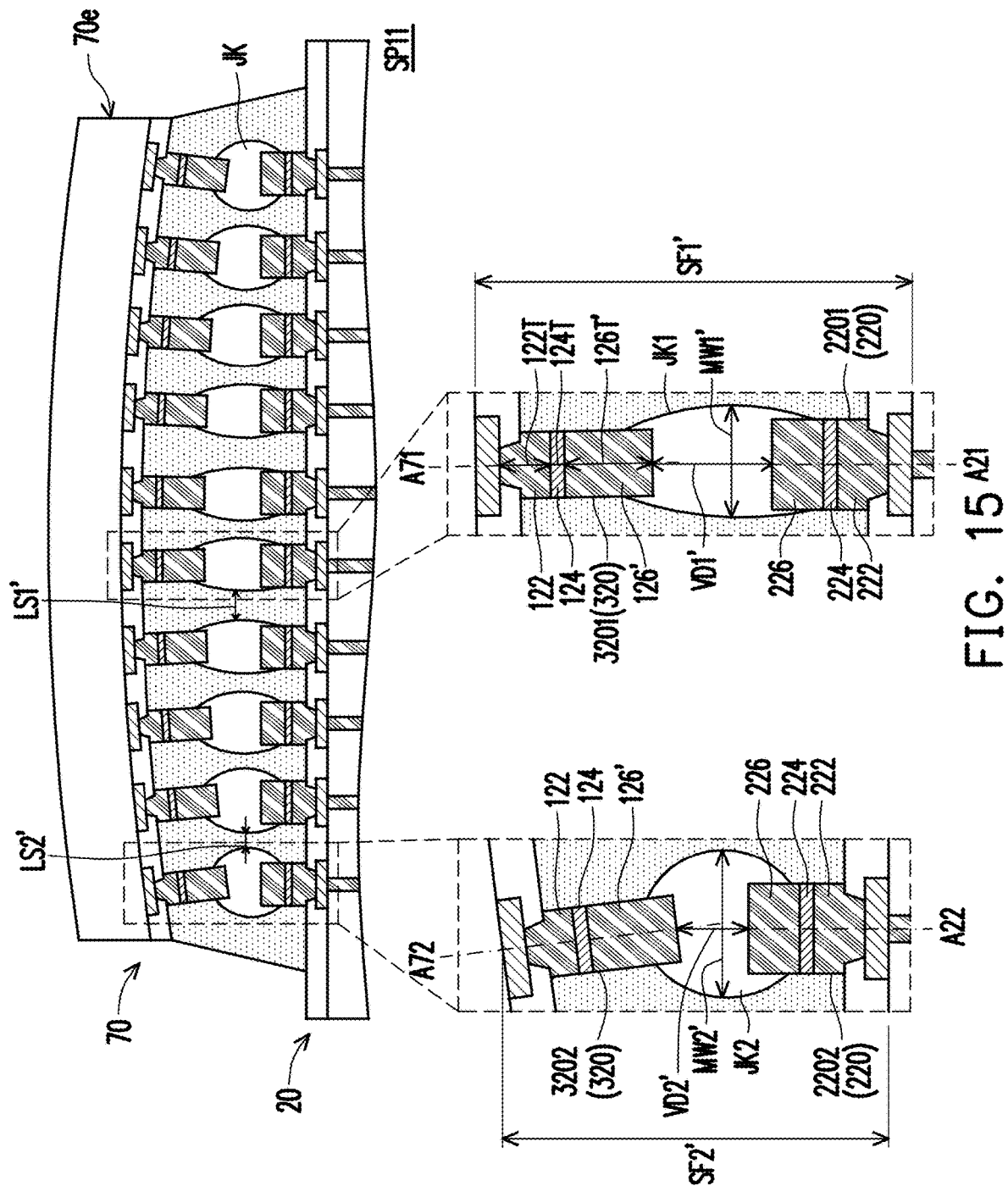

Referring to FIG. 15, a partial view of a semiconductor package SP11 is illustrated. The semiconductor package SP11 may be formed by coupling the first package component 70 to the second package component 20. The first package component 70 may be similar to the first package component 60 described above, except that the first conductive bump 320 has the third conductive layer 126' thicker than the corresponding first conductive layer 122. The respective first conductive bump 320 of the first package component 70 includes the third conductive layer 126' having the thickness 126T' greater than the thickness 122T of the first conductive layer 122. The second conductive layer 124 may have the thickness 124T be thinnest among the conductive layers of the first conductive bump 320. Alternatively, the third conductive layer 126' is a thickest layer of the first conductive bump 320 and the first conductive layer 122 is a thinnest layer of the first conductive bump 320. It is noted that the semiconductor package SP11 may be formed by the suitable method described above, so the details are not described herein.

Continue to FIG. 15, the semiconductor package SP11 includes the first package component 70 having the convex warpage profile which is similar to the first package component 60 of the semiconductor package SP9 described in FIG. 13. The joint structure JK coupling the first conductive bump 320 to the second conductive bump 220 may also be similar to the joint structure JI of the semiconductor package SP9 shown in in FIG. 13, and thus the detailed descriptions are simplified for the sake of brevity. In some embodiments, the standoff SF2' corresponding to the corner bumps (3202 and 2202) is less than the standoff SF1' corresponding to the center bumps (3201 and 2201). For example, the first package component 70 warps with the edges 70e bent downwardly, resulting in the central axis A72 of the corner bump 3202 being shifted relative to the central axis A22 of the corner bump 2202. The central axis A31 of the center bump 3201 being substantially aligned with the central axis A21 of the center bump 2201. With the convex warpage of the first package component 70, the vertical distance between the major surfaces of the corresponding first and second conductive bumps (320 and 220) may gradually decrease from a pair of the first and second conductive bumps located in the central region of the semiconductor package SP11 toward a pair of the first and second conductive bumps located in the peripheral region of the semiconductor package SP11. For example, the vertical distance VD1' between the center bumps (3201 and 2201) is greater than the vertical distance VD2' between the corner bumps (3202 and 2202).

Still referring to FIG. 15, the curvature of the outer surface of the joint structure JK1 covering the center bumps (3201 and 2201) may be less than the curvature of the outer surface of the joint structure JK2 covering the corner bumps (3202 and 2202). The curvature of the outer surface of the respective joint structure JK on a pair of the first and second conductive bumps (320 and 220) may gradually increase from the one covering the center bumps (3201 and 2201) toward the one covering the corner bumps (3202 and 2202). In some embodiments, the maximum width MW1' of the joint structure JK1 covering the center bumps (3201 and 2201) is less than the maximum width MW2' of the joint structure JK2 covering the corner bumps (3202 and 2202). The maximum width of the respective joint structure JK may increase from the one covering the center bumps (3201 and 2201) toward the one covering the corner bumps (3202 and 2202). The shortest lateral distance LS1' between the joint structure JK1 and its adjacent joint structure may be greater than the shortest lateral distance LS2' between the joint structure JK2 and its adjacent joint structure.

Figure 16:
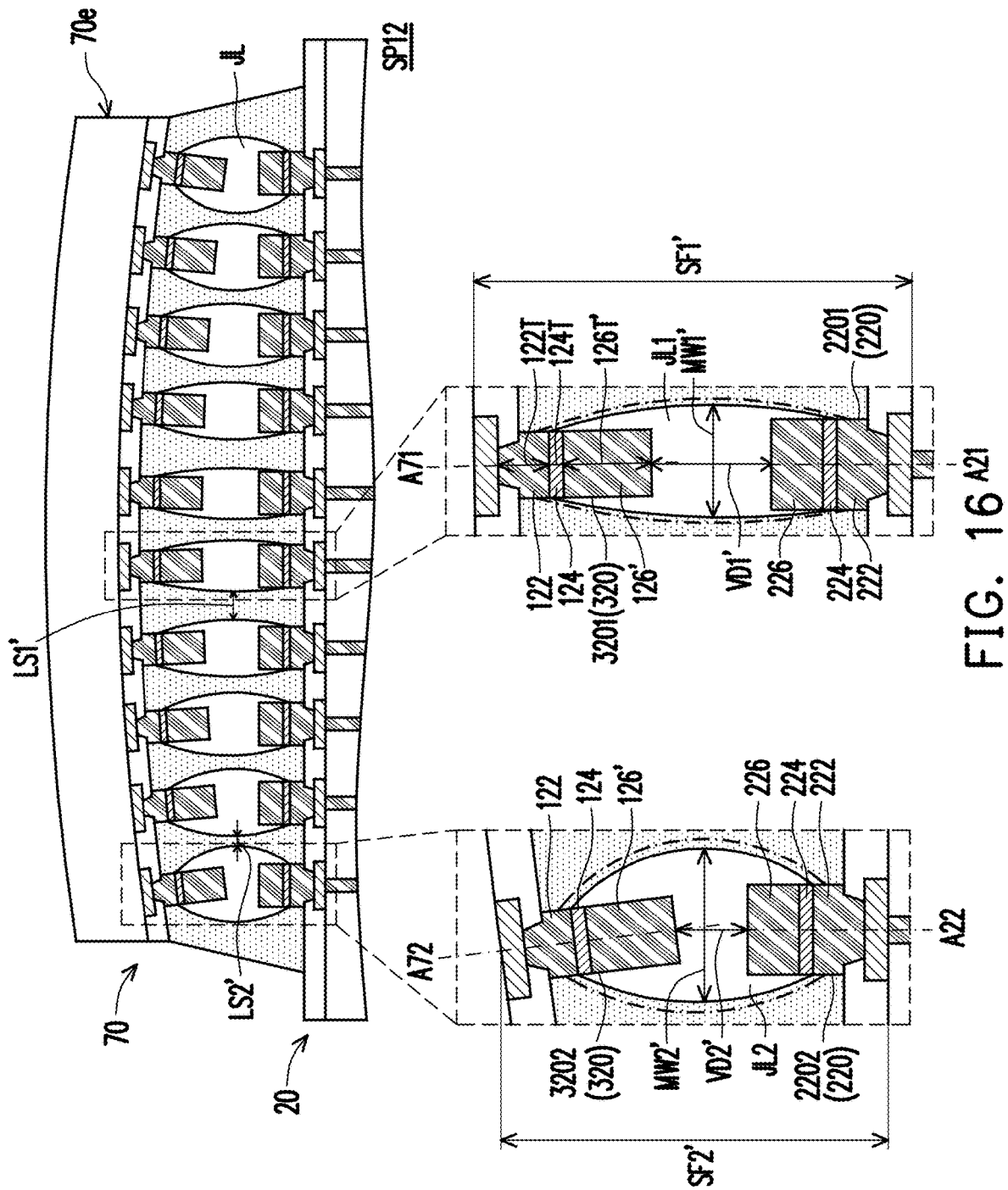

Referring to FIG. 16, a partial view of a semiconductor package SP12 is illustrated. The semiconductor package SP12 may be similar to the semiconductor package SP11 described in FIG. 15, except that the joint structure JL covers the third conductive layers (126' and 226) and further extends along the thickness direction to at least cover the second conductive layer(s) (124 and/or 224). In some embodiments, the joint structure further extends along the thickness direction to at least partially cover the first conductive layer(s) (122 and/or 222) as shown in the dot-dashed lines in the enlarged views. Again, the extent to which the joint structure JL covers the corresponding first and second conductive bumps (320 and 220) may be determined by the thicknesses (128T and 228T) of the fourth conductive layers (128A and 228A) as described in FIG. 6.

Continue to FIG. 16, the joint structure JL of the semiconductor package SP12 coupling the first conductive bump 320 and the second conductive bump 220 may be similar to that of the joint structure JK of the semiconductor package SP11 shown in FIG. 15, and thus the detailed descriptions of the joint structure JL are simplified herein. For example, the standoff between the first package component 70 and the second package component 20 gradually decreases from the center to the edges of the semiconductor package SP12 due to the convex warpage of the first package component 70. The standoff SF2' corresponding to the corner bumps (3202 and 2202) may be less than the standoff SF1' corresponding to the center bumps (3201 and 2201). As a result of the convex warpage of the first package component 70, the vertical distance between the major surfaces of the corresponding first and second conductive bumps (320 and 220) may gradually decrease from a pair of the first and second conductive bumps located in the central region of the semiconductor package SP12 toward a pair of the first and second conductive bumps located in the peripheral region of the semiconductor package SP12. The vertical distance VD2' between the corner bumps (3202 and 2202) may be less than the vertical distance VD1' between the center bumps (3201 and 2201).

Still referring to FIG. 16, the cross-sectional view of the joint structure JL of the semiconductor package SP12 may be similar to that of the joint structure JK of the semiconductor package SP11 shown in FIG. 15. For example, the curvature of the outer surface of the joint structure JL2 covering the corner bumps (3202 and 2202) is greater than the curvature of the outer surface of the joint structure JL1 covering the center bumps (3201 and 2201). The curvature of the outer surface of the respective joint structure JL on a pair of the first and second conductive bumps (320 and 220) may gradually decrease from the one covering the corner bumps (3202 and 2202) toward the one covering the center bumps (3201 and 2201). In some embodiments, the maximum width MW2' of the joint structure JL2 covering the corner bumps (3202 and 2202) is greater than the maximum width MW1' of the joint structure JL1 covering the center bumps (3201 and 2201). The maximum width of the respective joint structure JL may decrease from the one covering the corner bumps (3202 and 2202) toward the one covering the center bumps (3201 and 2201). The shortest lateral distance LS2' between the joint structure JL2 and its neighboring joint structure may be less than the shortest lateral distance LS1' between the joint structure JL1 and its neighboring joint structure.

Figure 17:
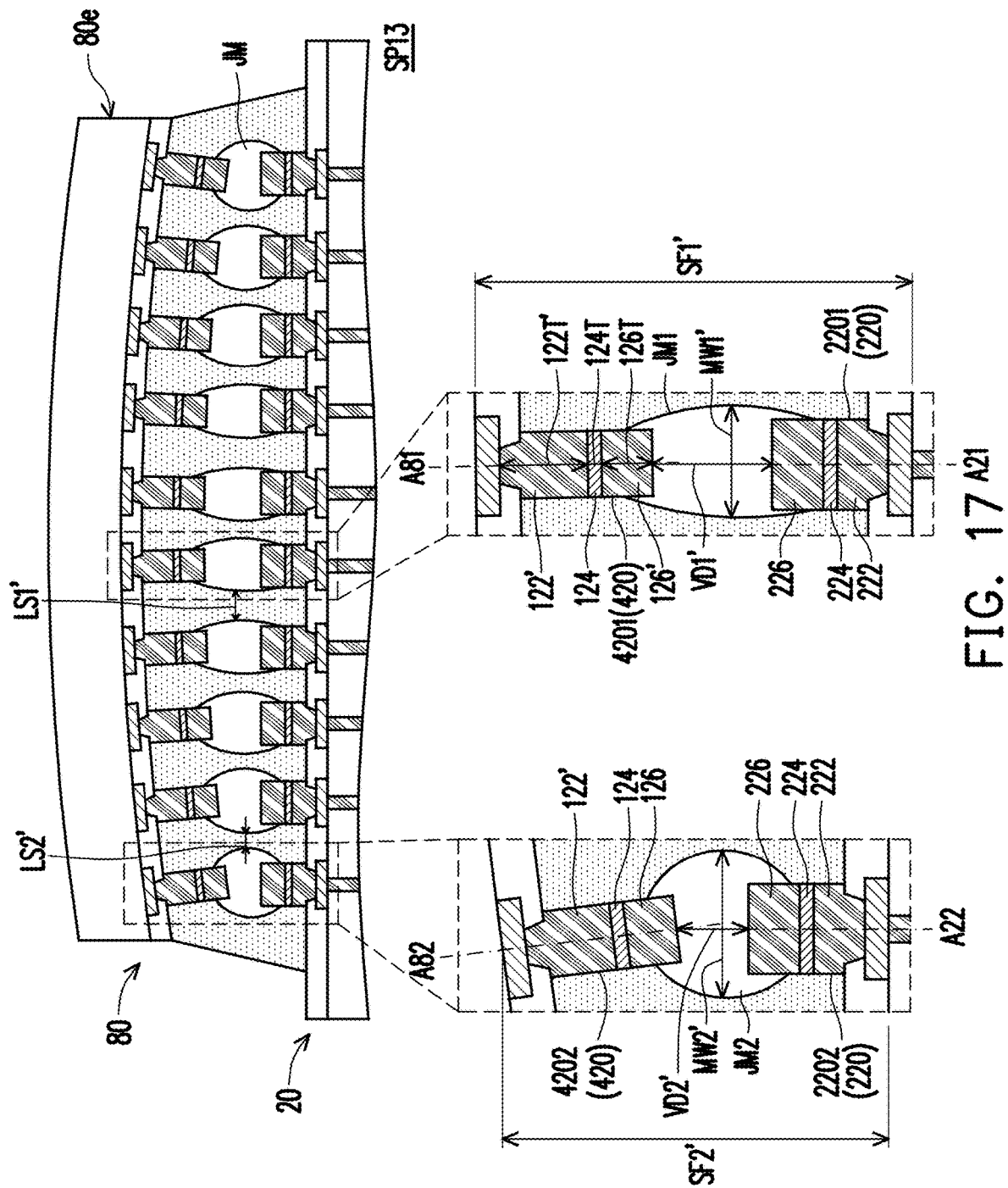

Referring to FIG. 17, a partial view of a semiconductor package SP13 is illustrated. The semiconductor package SP13 may be formed by coupling the first package component 80 to the second package component 20. The first package component 80 may be similar to the first package component 60 described in FIG. 13, except that the first conductive bump 420 has the first conductive layer 122' thicker than the corresponding third conductive layer 126. In other words, the respective first conductive bump 420 of the first package component 80 includes the first conductive layer 122' having the thickness 122T' greater than the thickness 126T of the third conductive layer 126. The second conductive layer 124 may have the smallest thickness 124T among the conductive layers of the first conductive bump 420. Alternatively, the first conductive layer 122' is a thickest layer of the first conductive bump 420 and the third conductive layer 126 is a thinnest layer of the first conductive bump 420. It is noted that the semiconductor package SP13 may be formed by the suitable method described above, so the details are not described herein.

Continue to FIG. 17, the joint structure JM coupling the first conductive bump 420 to the second conductive bump 220 may be similar to the joint structure JI of the semiconductor package SP9 shown in FIG. 13, and thus the detailed descriptions are simplified for the sake of brevity. For example, the standoff between the first package component 80 and the second package component 20 gradually decreases from the center to edges of the semiconductor package SP13 due to the convex warpage of the first package component 80. With the convex warpage, the standoff SF2' corresponding to the corner bumps (4202 and 2202) may be less than the standoff SF1' corresponding to the center bumps (4201 and 2201). For example, the first package component 80 warps with the edges 80e bent downwardly, resulting in the central axis A82 of the corner bump 4202 being offset relative to the central axis A22 of the corner bump 2202. The central axis A81 of the center bump 1201 may be substantially aligned with the central axis A21 of the center bump 2201 or may be slightly misaligned due to the warpage and/or formation process variations. As a result of the convex warpage of the first package component 80, the vertical distance between the major surfaces of the corresponding first and second conductive bumps (420 and 220) may gradually decrease from a pair of the first and second conductive bumps located in the central region of the semiconductor package SP13 toward a pair of the first and second conductive bumps located in the peripheral region of the semiconductor package SP13. For example, the vertical distance VD2' between the corner bumps (4202 and 2202) is less than the vertical distance VD1' between the center bumps (4201 and 2201).

Still referring to FIG. 17, the cross-sectional view of the joint structure JM of the semiconductor package SP13 may be similar to that of the joint structure JI of the semiconductor package SP9 shown in FIG. 13. For example, the curvature of the outer surface of the joint structure JM2 covering the corner bumps (4202 and 2202) is greater than the curvature of the outer surface of the joint structure JM1 covering the center bumps (4201 and 2201). The curvature of the outer surface of the respective joint structure JM on a pair of the first and second conductive bumps may gradually decrease from the one covering the corner bumps (4202 and 2202) toward the one covering the center bumps (4201 and 2201). In some embodiments, the maximum width MW2' of the joint structure JM2 covering the corner bumps (4202 and 2202) is greater than the maximum width MW1' of the joint structure JM1 covering the center bumps (4201 and 2201). The maximum width of the respective joint structure JM may decrease from the one covering the corner bumps (4202 and 2202) toward the one covering the center bumps (4201 and 2201). The shortest lateral distance LS2' between the joint structure JM2 and its neighboring joint structure may be less than the shortest lateral distance LS1' between the joint structure JM1 and its neighboring joint structure.

Figure 18:
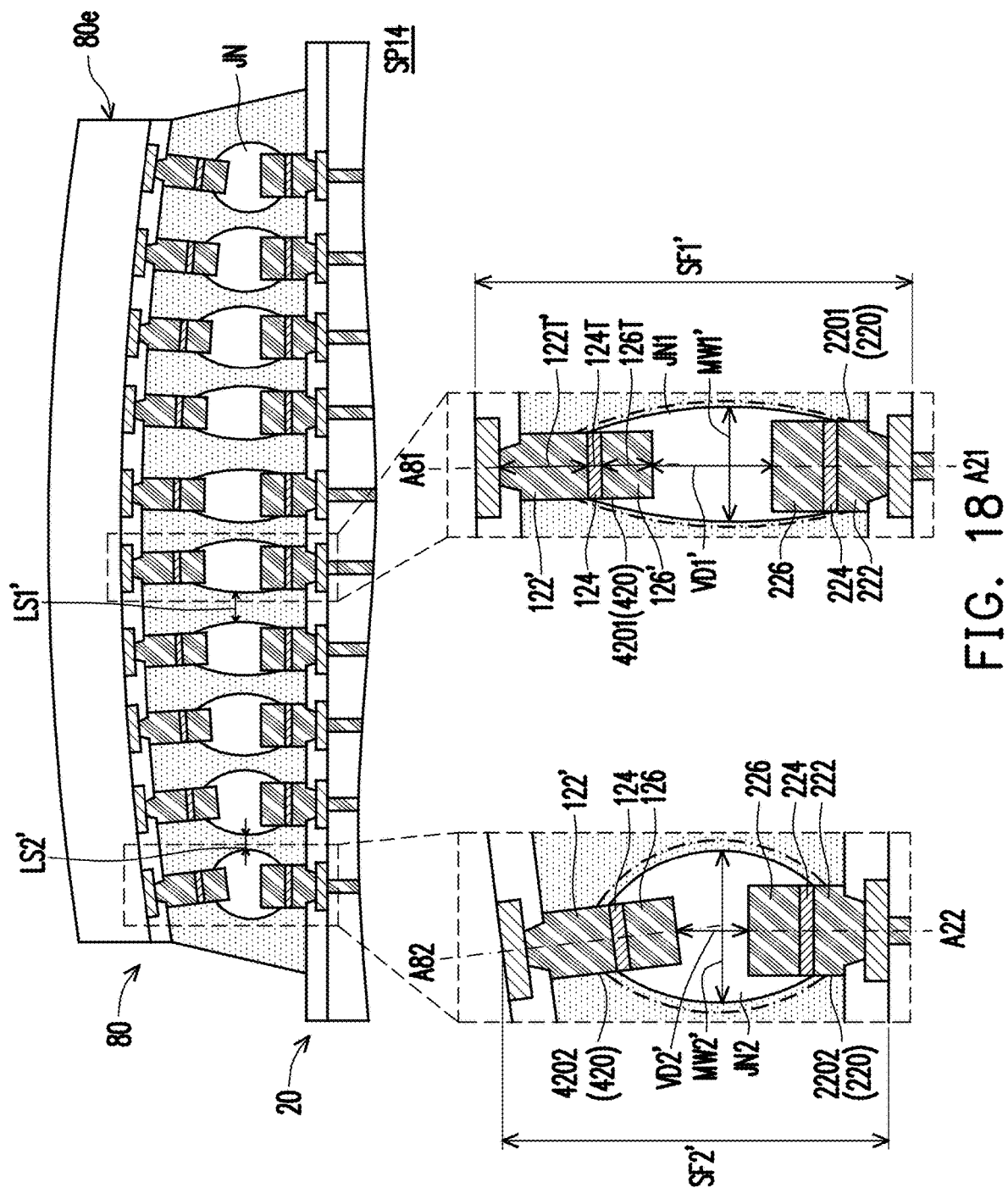

Referring to FIG. 18, a partial view of a semiconductor package SP14 is illustrated. The semiconductor package SP14 may be similar to the semiconductor package SP13 described in FIG. 17, except that the joint structure JN covers the third conductive layers (126 and 226) and further extends along the thickness direction to at least cover the second conductive layer(s) (124 and/or 224). In some embodiments, the joint structure further extends along the thickness direction to at least partially cover the first conductive layer(s) (122' and/or 222) as shown in the dot-dashed lines in the enlarged views. The extent to which the joint structure JF covers a pair of the first and second conductive bumps (420 and 220) may be determined by the thicknesses (128T and 228T) of the fourth conductive layers (128A and 228A) as described in FIG. 6.

Continue to FIG. 18, the joint structure JN of the semiconductor package SP14 coupling the first conductive bump 420 and the second conductive bump 220 may be similar to that of the joint structure JM of the semiconductor package SP13 shown in FIG. 17, so the detailed descriptions of the joint structure JN are simplified herein. For example, the standoff between the first package component 80 and the second package component 20 gradually increases from the edges to the center of the semiconductor package SP14 due to the convex warpage of the first package component 80. The standoff SF2' corresponding to the corner bumps (4202 and 2202) may be less than the standoff SF1' corresponding to the center bumps (4201 and 2201). As a result of the convex warpage of the first package component 80, the vertical distance between the major surfaces of the corresponding first and second conductive bumps may gradually increase from a pair of the first and second conductive bumps located in the peripheral region of the semiconductor package SP14 toward a pair of the first and second conductive bumps located in the central region of the semiconductor package SP14. For example, the vertical distance VD1' between the center bumps (4201 and 2201) is greater than the vertical distance VD2 between the corner bumps (4202 and 2202).

Still referring to FIG. 18, the cross-sectional view of the joint structure JN of the semiconductor package SP14 may be similar to that of the joint structure JM of the semiconductor package SP13. For example, the curvature of the outer surface of the joint structure JN1 covering the center bumps (4201 and 2201) is less than the curvature of the outer surface of the joint structure JN2 covering the corner bumps (4202 and 2202). The curvature of the outer surface of the respective joint structure JN on a pair of the first and second conductive bumps may gradually increase from the one covering the center bumps (4201 and 2201) toward the one covering the corner bumps (4202 and 2202). In some embodiments, the maximum width MW1' of the joint structure JN1 covering the center bumps (4201 and 2201) is less than the maximum width MW2' of the joint structure JN2 covering the corner bumps (4202 and 2202). The maximum width of the respective joint structure JN may increase from the one covering the center bumps (4201 and 2201) toward the one covering the corner bumps (4202 and 2202). The shortest lateral distance LS1' between the joint structure JN1 and its neighboring joint structure may be greater than shortest lateral distance LS2' between the joint structure JN2 and its neighboring joint structure.

Figure 19:
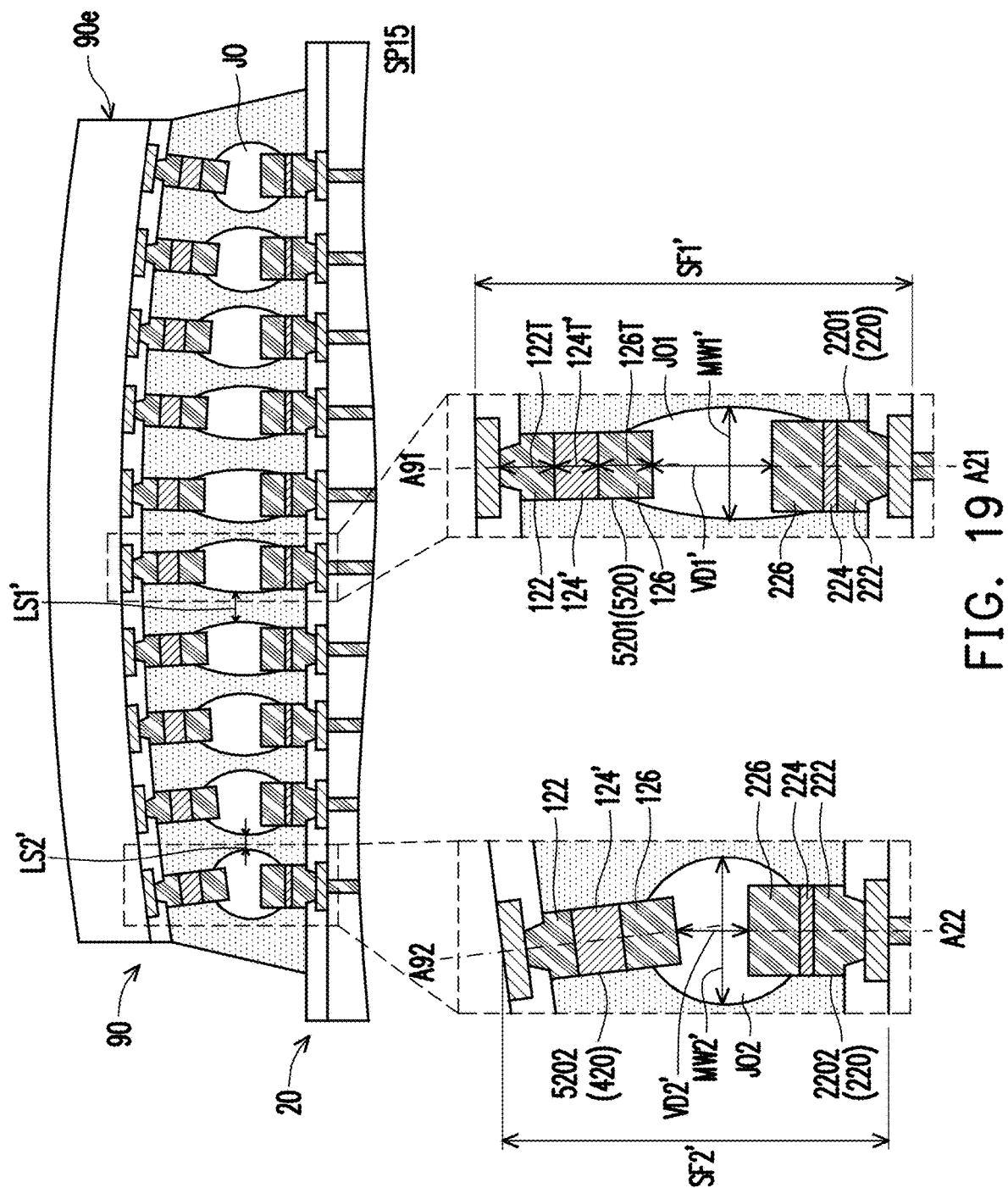

Referring to FIG. 19, a partial view of a semiconductor package SP15 is illustrated. The semiconductor package SP15 may be formed by coupling the first package component 90 to the second package component 20. The first package component 90 may be similar to the first package component 60 of the semiconductor package SP9 described in FIG. 13, except that the first conductive bump 520 has the second conductive layer 124' thicker than the corresponding first conductive layer 122 and/or the corresponding third conductive layer 126. In other words, the respective first conductive bump 520 of the first package component 90 includes the second conductive layer 124' having the thickness 124T' greater than the thickness 122T of the first conductive layer 122 and/or the thickness 126T of the third conductive layer 126. The second conductive layer 124' may be a thickest layer among the conductive layers of the first conductive bump 520. In some embodiments, the second conductive layer 124' is thicker than the first conductive layer 122 which may be of the same thickness as the third conductive layer 126. In some embodiments, the second conductive layer 124' is thicker than the first conductive layer 122, while the first conductive layer 122 is thicker than or thinner than the third conductive layer 126. It is noted that the semiconductor package SP15 may be formed by the suitable method described above, so the details are not described herein.

Continue to FIG. 19, the semiconductor package SP15 includes the first package component 90 having the convex warpage profile which is similar to the first package component 60 of the semiconductor package SP9 described in FIG. 13. The joint structure JO coupling the first conductive bump 520 to the second conductive bump 220 may also be similar to the joint structure JI of the semiconductor package SP9, and thus the detailed descriptions are simplified for the sake of brevity. For example, the standoff between the first package component 90 and the second package component 20 may gradually decrease from the center to edges of the semiconductor package SP15 due to the convex warpage of the first package component 90. With the convex warpage, the standoff SF2' corresponding to the corner bumps (5202 and 2202) may be less than the standoff SF1' corresponding to the center bumps (5201 and 2201).

For example, the first package component 90 warps with the edges 90e curving downwardly, resulting in the central axis A92 of the corner bump 5202 being offset relative to the central axis A22 of the corner bump 2202. The central axis A91 of the center bump 5201 may be substantially aligned with the central axis A21 of the center bump 2201 or may be misaligned due to the warpage and/or formation process variations. As a result of the convex warpage of the first package component 90, the vertical distance between the major surfaces of the corresponding first and second conductive bumps may gradually decrease from a pair of the first and second conductive bumps located in the central region of the semiconductor package SP15 toward a pair of the first and second conductive bumps located in the peripheral region of the semiconductor package SP15. For example, the vertical distance VD2' between the corner bumps (5202 and 2202) is less than the vertical distance VD1' between the center bumps (5201 and 2201).

Still referring to FIG. 19, the cross-sectional view of the joint structure JO of the semiconductor package SP15 may be similar to that of the joint structure JI of the semiconductor package SP9. For example, the curvature of the outer surface of the joint structure JO2 covering the corner bumps (5202 and 2202) is greater than the curvature of the outer surface of the joint structure JO1 covering the center bumps (5201 and 2201). The curvature of the outer surface of the respective joint structure JO on a pair of the first and second conductive bumps may gradually decrease from the one covering the corner bumps (5202 and 2202) toward the one covering the center bumps (5201 and 2201). In some embodiments, the maximum width MW2' of the joint structure JO2 covering the corner bumps (5202 and 2202) is greater than the maximum width MW1' of the joint structure JO1 covering the center bumps (5201 and 2201). The maximum width of the respective joint structure JO may decrease from the one covering the corner bumps (5202 and 2202) toward the one covering the center bumps (5201 and 2201). The shortest lateral distance LS2' between the joint structure JO2 and its neighboring joint structure may be less than the shortest lateral distance LS1' between the joint structure JO1 and its neighboring joint structure.

Figure 20:
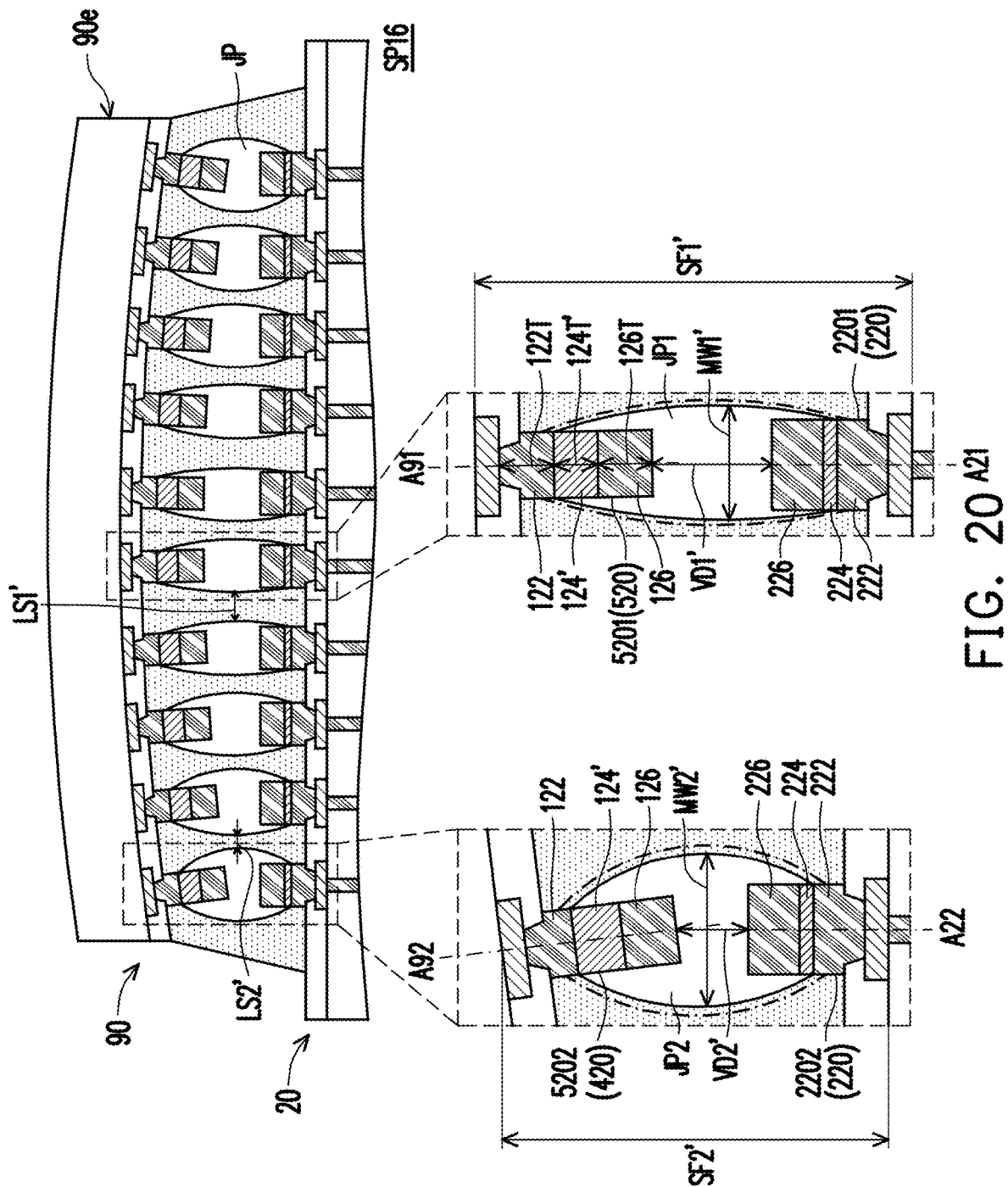

Referring to FIG. 20, a partial view of a semiconductor package SP16 is illustrated. The semiconductor package SP16 may be similar to the semiconductor package SP15 described in FIG. 19, except that the joint structure JP covers the third conductive layers (126 and 226) and further extends along the thickness direction to at least cover the second conductive layer(s) (124' and/or 224). In some embodiments, the joint structure further extends along the thickness direction to at least partially cover the first conductive layer(s) (122 and/or 222) as shown in the dot-dashed lines in the enlarged views. The extent to which the joint structure JP covers a pair of the first and second conductive bumps (520 and 220) may be determined by the thicknesses (128T and 228T) of the fourth conductive layers (128A and 228A) as described in FIG. 6.

Continue to FIG. 20, the joint structure JP of the semiconductor package SP16 coupling the first conductive bump 520 and the second conductive bump 220 may be similar to that of the joint structure JO of the semiconductor package SP15, so the detailed descriptions of the joint structure JP are simplified herein. For example, the standoff between the first package component 90 and the second package component 20 gradually increases from the edges to the center of the semiconductor package SP16 due to the convex warpage of the first package component 90. As a result of the convex warpage of the first package component 90, the vertical distance between the major surfaces of the corresponding first and second conductive bumps may gradually increase from a pair of the first and second conductive bumps located in the peripheral region of the semiconductor package SP16 toward a pair of the first and second conductive bumps located in the central region of the semiconductor package SP16. For example, the vertical distance VD1' between the center bumps (5201 and 2201) is greater than the vertical distance VD2' between the corner bumps (5202 and 2202).

Still referring to FIG. 20, the cross-sectional view of the joint structure JP of the semiconductor package SP16 may be similar to that of the joint structure JI of the semiconductor package SP13. For example, the curvature of the outer surface of the joint structure JP1 covering the center bumps (5201 and 2201) is less than the curvature of the outer surface of the joint structure JP2 covering the corner bumps (5202 and 2202). The curvature of the outer surface of the respective joint structure JP on a pair of the first and second conductive bumps (520 and 220) may gradually increase from the one covering the center bumps (5201 and 2201) toward the one covering the corner bumps (5202 and 2202). In some embodiments, the maximum width MW1' of the joint structure JP1 covering the center bumps (5201 and 2201) is less than the maximum width MW2' of the joint structure JP2 covering the corner bumps (5202 and 2202). The maximum width of the respective joint structure JP may increase from the one covering the center bumps (5201 and 2201) toward the one covering the corner bumps (5202 and 2202). The shortest lateral distance LS1' between the joint structure JP1 and its neighboring joint structure may be greater than shortest lateral distance LS2' between the joint structure JP2 and its neighboring joint structure.

Figure 21:
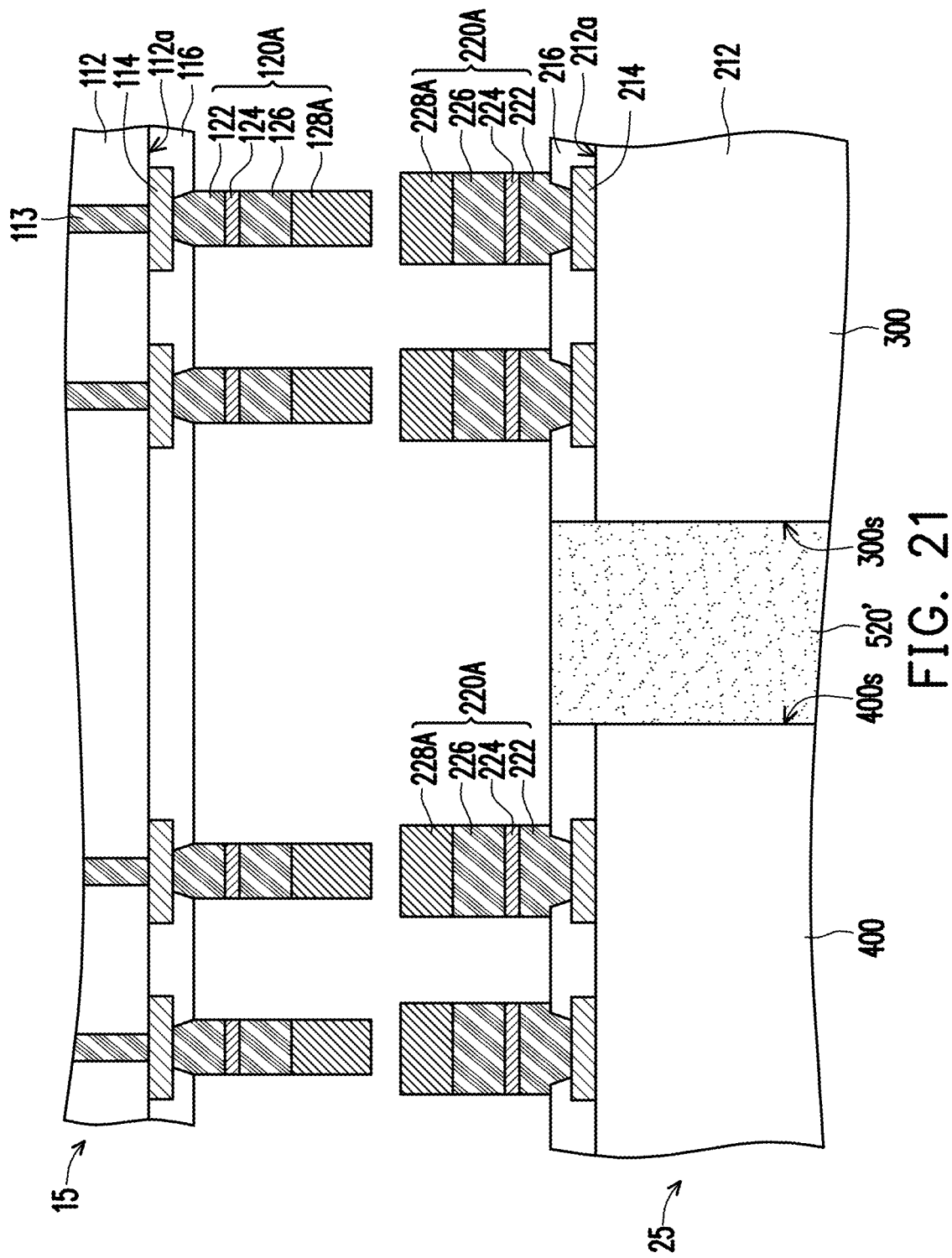
FIG. 21 is a schematic cross-sectional view illustrating package components to be bonded in accordance with some embodiments.
Figure 22:
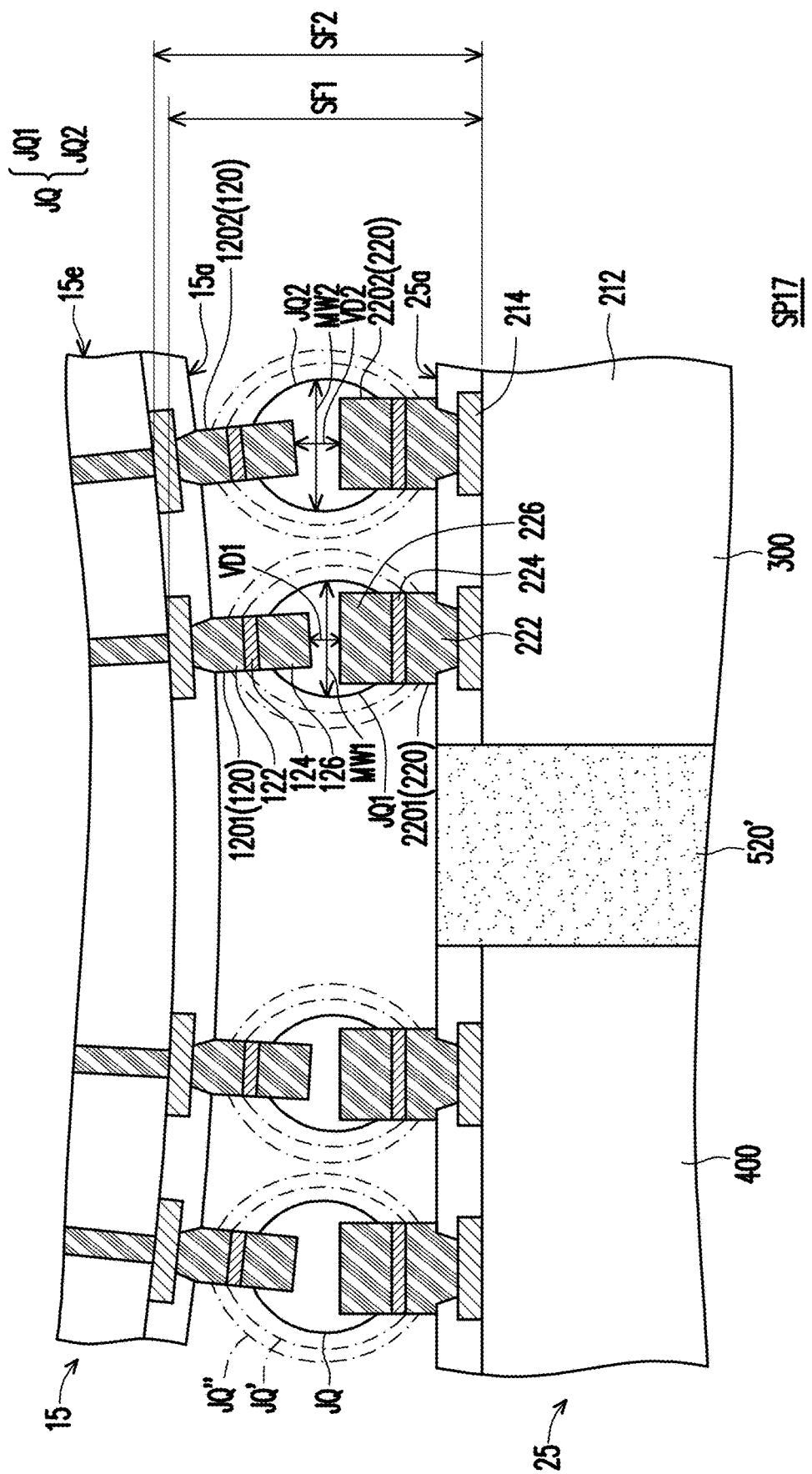
FIGS. 22-23 are schematic cross-sectional views illustrating a portion of a semiconductor package including package components bonded together in accordance with various embodiments.
Figure 23:
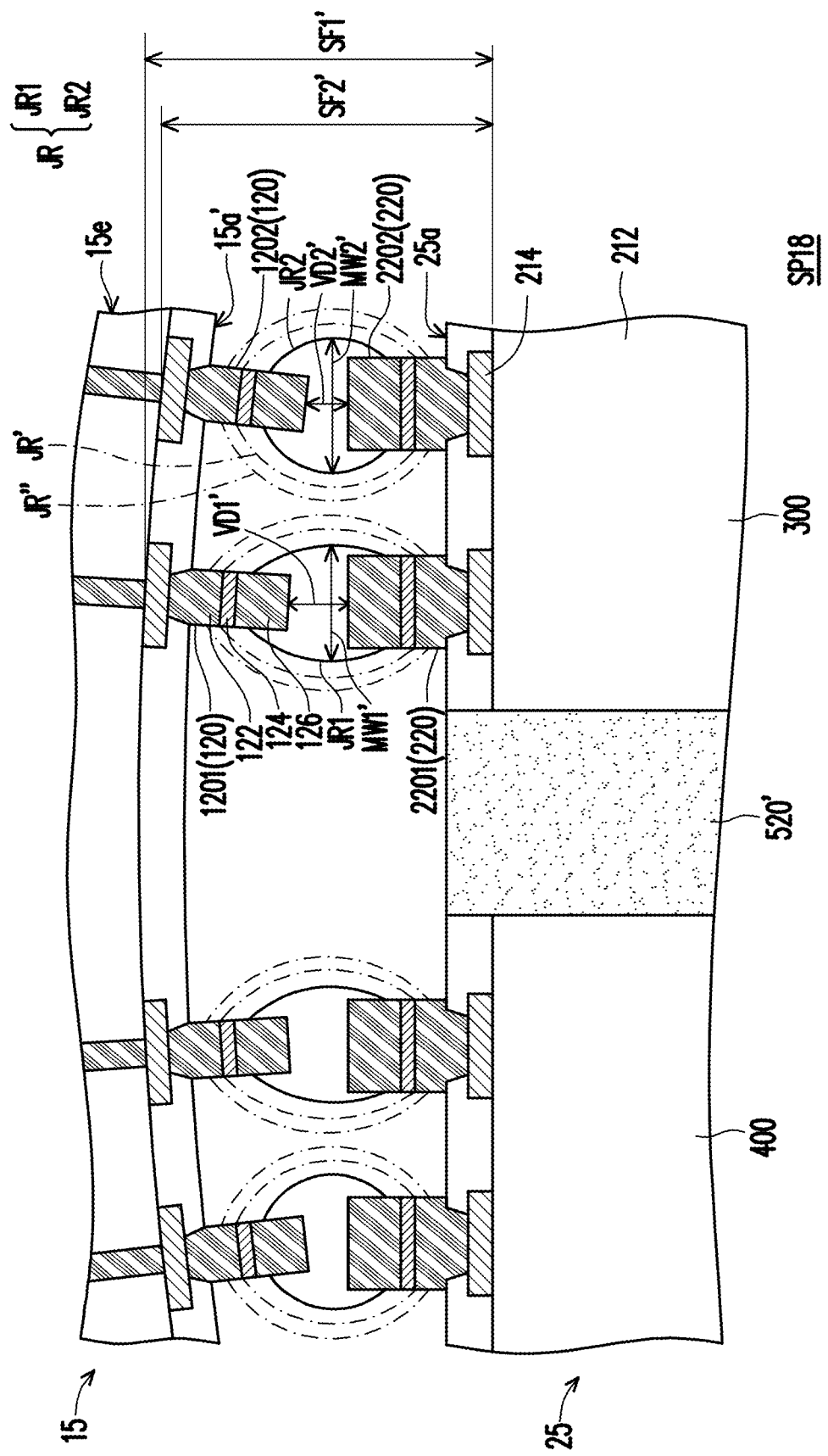

FIG. 21 is a schematic cross-sectional view illustrating package components to be bonded in accordance with some embodiments, and FIGS. 22-23 are schematic cross-sectional views illustrating a portion of a semiconductor package including package components bonded together in accordance with various embodiments. Throughout the various views and illustrative embodiments of the disclosure, like reference numbers are used to designate like elements. Referring to FIG. 21, a first package component 15 and a second package component 25 are designed and fabricated respectively, and the first package component 15 is to be bonded to the second package component 25. The first package component 15 may be similar to the first package component 10 described in FIG. 3, except that the first package component 15 includes a plurality of through substrate vias (TSVs) 113 penetrating through the first semiconductor substrate 112 and connected to the first conductive pads 114 for providing vertically electrical connection between opposing sides of the first semiconductor substrate 112.

The second package component 25 may include semiconductor dies (300 and 400) laterally covered by an insulating encapsulation 520'. The semiconductor dies (300 and 400) may include integrated circuits performing the same or different functions (e.g., memory structures, processing structures, sensors, amplifiers, power distribution, input/output circuitry, or the like). For example, the semiconductor dies (300 and 400) is a packaged die which may be or may include any type of integrated circuit device, such as a logic device, memory device (e.g., SRAM, DRAM, high-bandwidth memory stack, etc.), RF device, input/output (I/O) device, system-on-chip (SoC) device, combinations thereof, and other suitable types of devices. The semiconductor die(s) 300 and/or 400 may include the second conductive pads 214 distributed over the major surface 212a of the second semiconductor substrate 212, the second passivation layer 216 formed on the major surface 212a of the second semiconductor substrate 212 to partially cover the second conductive pads 214, and the second conductive bumps 220A including the stacked conductive layers (e.g., 222, 224, 226, and 228A) formed on the second conductive pads 214. For example, the insulating encapsulation 520' extends along the sidewalls (300s and 400s) of the semiconductor dies (300 and 400) The insulating encapsulation 520' may include a molding compound, epoxy, the like, or other suitable electrically insulating materials, and may be applied by compression molding, transfer molding, or the like.

Continue to FIG. 21, the first package component 15 may be picked and placed on the second package component 25 with each of the first conductive bumps 120A substantially aligned with one of the second conductive bumps 220A of the semiconductor dies (300 and 400). The first conductive bumps 120A of the first package component 15 may have a smaller critical dimension as compared to the critical dimension of the second conductive bumps 220A of the semiconductor die(s) (300 and/or 400). The fourth conductive layer 128A (i.e. the solder-containing layer) of the respective first conductive bump 120A may be thicker than the fourth conductive layer 228A of the corresponding second conductive bump 220A. The first conductive bumps 120A and the second conductive bumps 220A may be similar to the first conductive bumps 120A and the second conductive bumps 220A described in FIG. 3, so the detailed descriptions are not repeated for the sake of brevity. In some embodiments, the second conductive bumps of the semiconductor die(s) (300 and/or 400) have different critical dimensions. Under this scenario, the first conductive bumps of the first package component may have variable critical dimensions depending on the corresponding critical dimensions of the second conductive bumps of the semiconductor dies (300 and 400).

Referring to FIG. 22, after placing the first package component 15 on the second package component 25, the reflow process may be performed to couple the first package component 15 to the second package component 25. The reflow process may be similar to the process described in preceding paragraphs, so the detailed descriptions are not repeated for the sake of brevity. In some embodiments, after the reflow, the first package component 15 is bonded to the second package component 25 to form a semiconductor package SP17, and the semiconductor dies (300 and 400) may be electrically coupled to each other through the first package component 15. The first package component 15 may be viewed as a bridge die in the semiconductor package SP17 for interconnecting the semiconductor dies (300 and 400).

In some embodiments, after the reflow, the first package component 15 has a concave warpage. For example, the first package component 15 warps with the edges 15e curving upwardly, where the peripheral region of the first package component 15 is higher than the central region of the first package component 15, relative to the major surface 25a of the second package component 25. The major surface 15a of the first package component 15 may present a concave curve in the cross-sectional view, resulting in the first conductive bump 120 within/near the central region (referred to the center bump 1201) of the first package component 15 being lower than the first conductive bump 120 within/near the peripheral region (referred to the corner bump 1202) of the first package component 15. In some embodiments, the standoff SF1 in the central region is less than the standoff SF2 in the peripheral region. For example, the standoff SF2 corresponding to the corner bumps (1202 and 2202) is greater than the standoff SF1 corresponding to the center bumps (1201 and 2201). The vertical distance VD1 between the center bumps (1201 and 2201) may be less than the vertical distance VD2 between the corner bumps (1202 and 2202).

In some embodiments, after the reflow, the corresponding fourth conductive layers (128A and 228A) are combined together to form a joint structure JQ coupling the first conductive bump 120 to the corresponding second conductive bump 220. The cross-sectional view of the joint structure JQ of the semiconductor package SP17 may be similar to that of the joint structure JA of the semiconductor package SP1 shown in FIG. 5, so the detailed descriptions of the joint structure JQ are simplified herein. For example, the curvature of the outer surface of the joint structure JQ2 covering the corner bumps (1202 and 2202) is less than the curvature of the outer surface of the joint structure JQ1 covering the center bumps (1201 and 2201). In some embodiments, the maximum width MW2 of the joint structure JQ2 covering the corner bumps (1202 and 2202) is less than the maximum width MW1 of the joint structure JQ1 covering the center bumps (1201 and 2201). The maximum width of the respective joint structure JQ may increase from the one covering the corner bumps (1202 and 2202) toward the one covering the center bumps (1201 and 2201).

In some embodiments, the joint structure JQ on a pair of first and second conductive bumps (120 and 220) at least covers the third conductive layers (126 and 226) of the pair of first and second conductive bumps (120 and 220). In some embodiments, the joint structure JQ' further extends along the thickness direction to at least partially cover the second conductive layer(s) (124 and/or 224) as shown in the dashed lines. In some embodiments, the joint structure JQ" extend beyond the second conductive layers (124 and 224) along the thickness direction to cover the first conductive layer(s) (122 and/or 222) as shown in the dot-dashed lines. The extent to which the joint structure JQ covers the corresponding first and second conductive bumps (120 and 220) may be determined by the thicknesses of the fourth conductive layers (128A and 228A) as described in preceding paragraphs. The first conductive bumps 120 of the first package component 15 may be replaced with other types of the first conductive bumps (e.g., 320 in FIG. 7, 420 in FIG. 9, 520 in FIG. 11) shown in the variations of the embodiments discussed elsewhere in the disclosure.

Referring to FIG. 23, a partial cross-sectional view of a semiconductor package SP18 is illustrated. The semiconductor package SP18 formed by bonding the first package component 15 to the second package component 25 may be similar to the semiconductor package SP17 shown in FIG. 22, except that the first package component 15 has a convex warpage profile after the reflow. For example, the first package component 15 warps with the edges 15e' bent downwardly, where the central region of the first package component 15 is higher than the peripheral region of the first package component 15, relative to the major surface 25a of the second package component 25. The major surface 15a' of the first package component 15 may present a convex curve in the cross-sectional view, resulting in the corner bump 1202 being lower than the center bump 1201. The vertical distance VD1' between the center bumps (1201 and 2201) is greater than the vertical distance VD2' between the corner bumps (1202 and 2202) due to the convex warpage of the first package component 15. The semiconductor package SP18 may have the higher standoff at the central region and the lower standoff at the peripheral region. For example, the standoff SF1' corresponding to the center bumps (1201 and 2201) is greater than the standoff SF2' corresponding to the corner bumps (1202 and 2202).

Continue to FIG. 23, the first conductive bump 120 of the first package component 15 may be coupled to the corresponding second conductive bump 220 of the second package component 25 through the joint structure JR. The cross-sectional view of the joint structure JR of the semiconductor package SP18 may be similar to that of the joint structure JI of the semiconductor package SP9 shown in FIG. 13, so the detailed descriptions of the joint structure JR are simplified herein. For example, in the cross-sectional view, the curvature of the outer surface of the joint structure JR1 covering the center bumps (1201 and 2201) is less than the curvature of the outer surface of the joint structure JR2 covering the corner bumps (1202 and 2202). In some embodiments, a maximum width MW1' of the joint structure JR1 covering the center bumps (1201 and 2201) is less than a maximum width MW2' of the joint structure JR2 covering the corner bumps (1202 and 2202).

For example, the joint structure JR1 is interposed between the center bumps (1201 and 2201) and may at least partially cover the third conductive layers 126 of the center bump 1201 and the third conductive layer 226 of the center bump 2201. The joint structure JR2 is interposed between the corner bumps (1202 and 2202) and may at least partially cover the third conductive layer 126 of the corner bump 1202 and the third conductive layer 226 of the corner bump 2202. In some embodiments, the joint structure JR' may extend to cover the second conductive layers (124 and 224) as indicated by the dashed lines. In other embodiments, the joint structure JR" extends beyond the second conductive layers (124 and 224) to cover the first conductive layers (122 and 222) as indicated by the dot-dashed lines, if the sufficient amount of solder is applied. Again, the extent to which the joint structure JR covers the corresponding first and second conductive bumps (120 and 220) may be determined by the thicknesses of the fourth conductive layers (128A and 228A) as described above. The first conductive bumps 120 of the first package component 15 may be replaced with other types of the first conductive bumps (e.g., 320 in FIG. 7, 420 in FIG. 9, 520 in FIG. 11) shown in the variations of the embodiments discussed elsewhere in the disclosure.

Figure 24:
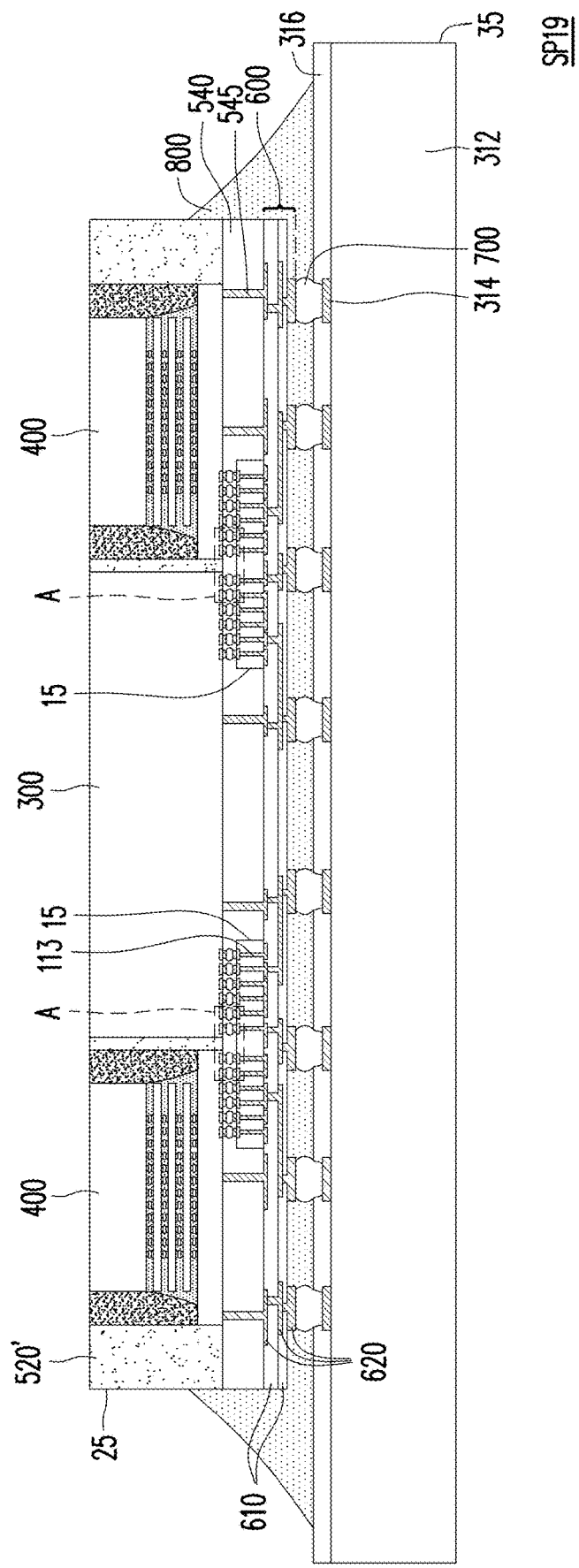
FIG. 24 is a schematic cross-sectional view of a semiconductor package including a joint structure in accordance with some embodiments.

FIG. 24 is a schematic cross-sectional view of a semiconductor package including a joint structure in accordance with some embodiments. Referring to FIG. 24 and also with reference to FIGS. 22-23, a semiconductor package SP19 is provided. The semiconductor package SP19 includes a plurality of first package components 15 bonded to the second package component 25. The enlarged cross-sectional view of the dashed areas A outlined in FIG. 24 may be similar to the structure shown in FIG. 22 or the structure shown in FIG. 23. In some embodiments, the semiconductor package SP19 includes an insulating layer 540 formed on the second package component 25 to laterally encapsulate the first package components 15. The insulating layer 540 may include any suitable material such as an epoxy resin, a molding underfill, and/or other suitable electrically insulating material, and may be formed by molding or other suitable deposition method(s).

In some embodiments, the semiconductor package SP19 includes a redistribution structure 600 formed on the first components 15 and the insulating layer 540 opposite to the second package component 25. The redistribution structure 600 including at least one patterned dielectric layer 610 and at least one patterned conductive layer 620 embedded in the patterned dielectric layer 610 may be electrically coupled to the semiconductor dies (300 and 400) of the second package component 25 through the first package components 15. For example, the patterned conductive layer 620 is in physical and electrical contact with the first package components 15. The patterned conductive layer 620 may be referred to as the redistribution layer (RDL) or the redistribution lines. Two patterned dielectric layers 610 and three patterned conductive layers 620 are shown in FIG. 24, but more or fewer patterned dielectric layers and patterned conductive layers may be present.

In some embodiments, the semiconductor package SP19 includes a plurality of through insulating vias (TIVs) 545 penetrating through the insulating layer 540 to provide vertical and electrical connection for connecting the second package component 25 and the redistribution structure 600. In some embodiments, the semiconductor package SP19 includes a third package component 35, and the redistribution structure 600 is electrically coupled to the third package component 35 through a plurality of conductive connectors 700. The conductive connectors 700 may be or may include controlled collapse chip connection (C4) bumps, metal pillars, solder balls, ball grid array (BGA) connectors, electroless nickel-electroless palladium-immersion gold (ENEPIG) formed bumps, or the like. The third package component 35 may be or may include a package substrate, board (e.g., a printed circuit board (PCB), a system board, a mother board, etc.), a wafer, a chip, an interposer substrate, or other suitable circuit substrate. For example, the third package component 35 includes a plurality of contact pads 314 distributed over a substrate 312 and a polymer layer 316 partially revealing the contact pads 314. The polymer layer 316 may be a solder mask layer for preventing solder from bridging between conductors and creating short circuits. The contact pads 314 may be coupled to the patterned conductive layer 620 of the redistribution structure 600 through the conductive connectors 700 after performing a reflow process.

The semiconductor package SP19 optionally includes an underfill layer 800 formed in the space between the redistribution structure 600 and the third package component 35 to surround the conductive connectors 700 for protection. The underfill layer 800 may cover the sidewalls of the redistribution structure 600 or further extend to cover the insulating layer 540 and/or the second package component 25. The underfill layer 800 may be made of polymers, such as resin, epoxy, or other suitable materials. In some embodiments, the underfill layer 800 includes fillers (e.g., silica) to adjust the mechanical strength. It should be noted that the semiconductor package SP19 is merely shown for illustrative purposes only, and other embodiments may include more elements or fewer elements in the semiconductor package.

For example, the semiconductor package SP19 is formed using a wafer level packaging (WLP), a chip-on-wafer-on-substrate (CoWoS) process, a chip-on-chip-on-substrate (CoCoS) process, etc. Other packaging techniques may be used to form the semiconductor package SP19, which are not limited in the disclosure. The semiconductor package SP19 may be a part of an electronic system for such as computers (e.g., high-performance computer), computational devices used in conjunction with an artificial intelligence system, wireless communication devices, computer-related peripherals, entertainment devices, etc. The semiconductor package SP19 including the joint structure(s) discussed herein may provide reliable electrical contacts between the package components. It is noted that other electronic applications are also possible.

According to some embodiments, a method includes: forming a first package component, wherein the first package component comprises a first conductive bump and a second conductive bump; forming a second package component, wherein the second package component comprises a third conductive bump and a fourth conductive bump, and dimensions of the first and second conductive bumps are less than dimensions of the third and fourth conductive bumps; and forming a first joint structure and a second joint structure to bond the second package component to the first package component. The first joint structure covers an entirety of a bottom surface of the first conductive bump of the first package component and an entirety of a top surface of the third conductive bump of the second package component, the first joint structure further extends to cover a sidewall of the first conductive bump of the first package component and a sidewall of the third conductive bump of the second package component. The second joint structure covers an entirety of a bottom surface of the second conductive bump of the first package component and an entirety of a top surface of the fourth conductive bump of the second package component, the second joint structure further extends to cover a sidewall of the second conductive bump of the first package component and a sidewall of the fourth conductive bump of the second package component. A first angle between an exposed sidewall of the first conductive bump and a tangent line at an end point of a boundary of the first joint structure on the sidewall of the first conductive bump is less than a second angle between an exposed sidewall of the second conductive bump and a tangent line at an end point of a boundary of the second joint structure on the sidewall of the second conductive bump.

According to some alternative embodiments, a method includes: forming an insulating encapsulation to laterally cover a first semiconductor die and a second semiconductor die, wherein each of the first semiconductor die comprises peripheral conductive bumps and central conductive bumps, the peripheral conductive bumps of the first semiconductor die are disposed on a peripheral region of the first semiconductor die that is between a central region of the first semiconductor die and the insulating encapsulation, and the peripheral conductive bumps of the second semiconductor die are disposed on a peripheral region of the second semiconductor die that is between a central region of the second semiconductor die and the insulating encapsulation; disposing a package component on the first semiconductor die, the second semiconductor die, and the insulating encapsulation, wherein the package component comprises central conductive bumps disposed on a central region of the package component and peripheral conductive bumps disposed on a peripheral region of the package component that surrounds the central region of the package component; and bonding the package component to the first semiconductor die and the second semiconductor die. The central conductive bumps of the package component are bonded to the peripheral conductive bumps of the first semiconductor die and the peripheral conductive bumps of the second semiconductor die through first joint structure. The peripheral conductive bumps of the package component are bonded to the central conductive bumps of the first semiconductor die and the central conductive bumps of the second semiconductor die through second joint structures. The central conductive bumps and the peripheral conductive bumps of the package component comprise dimensions less than dimensions of the corresponding peripheral conductive bumps and the corresponding central conductive bumps of the first semiconductor die and the second semiconductor die. A first angle between a sidewall of the respective central conductive bump of the package component and a tangent line at an end point of a boundary of the corresponding first joint structure on the sidewall of the respective central conductive bump of the package component is less than a second angle between a sidewall of the respective peripheral conductive bump of the package component and a tangent line at an end point of a boundary of the corresponding second joint structure on the sidewall of the respective peripheral conductive bump of the package component.

According to some alternative embodiments, a method includes: forming an upper package component, wherein the upper package component comprises a central region, a peripheral region surrounding the central region, central conductive bumps disposed on the central region, and peripheral conductive bumps disposed on the peripheral region; forming a lower package component, wherein the lower package component; and forming first joint structures and second joint structures to connect the upper and lower package components. The lower package component includes: a first semiconductor die comprising a central region, a peripheral region surrounding the central region, a central conductive bump disposed on the central region, and a peripheral conductive bump disposed on the peripheral region; a second semiconductor die comprising a central region, a peripheral region surrounding the central region, a central conductive bump disposed on the central region, and a peripheral conductive bump disposed on the peripheral region; and an insulating encapsulation laterally covering the first and second semiconductor dies and between the peripheral regions of the first and second semiconductor dies. One of the first joint structures wraps the peripheral conductive bump of the first semiconductor die and one of the central conductive bumps of the upper package component, and another one of the first joint structures wraps the peripheral conductive bump of the second semiconductor die and another one of the central conductive bumps of the upper package component. One of the second joint structures wraps the central conductive bump of the first semiconductor die and one of the peripheral conductive bumps of the upper package component, and another one of the second joint structures wraps the central conductive bump of the second semiconductor die and another one of the peripheral conductive bumps of the upper package component. A first angle between a sidewall of the one of the central conductive bumps of the upper package component and a tangent line at an end point of a boundary of the one of the first joint structures on the sidewall of the one of the central conductive bumps of the upper package component is less than a second angle between a sidewall of the one of the peripheral conductive bumps of the upper package component and a tangent line at an end point of a boundary of the one of the second joint structures on the sidewall of the one of the peripheral conductive bumps of the upper package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first package component, wherein the first package component comprises a first conductive bump and a second conductive bump;
   forming a second package component, wherein the second package component comprises a third conductive bump and a fourth conductive bump, and dimensions of the first and second conductive bumps are less than dimensions of the third and fourth conductive bumps; and
   forming a first joint structure and a second joint structure to bond the second package component to the first package component, wherein:
      the first joint structure covers an entirety of a bottom surface of the first conductive bump of the first package component and an entirety of a top surface of the third conductive bump of the second package component, the first joint structure further extends to cover a sidewall of the first conductive bump of the first package component and a sidewall of the third conductive bump of the second package component,
      the second joint structure covers an entirety of a bottom surface of the second conductive bump of the first package component and an entirety of a top surface of the fourth conductive bump of the second package component, the second joint structure further extends to cover a sidewall of the second conductive bump of the first package component and a sidewall of the fourth conductive bump of the second package component,
      a first angle between an exposed sidewall of the first conductive bump and a tangent line at an end point of a boundary of the first joint structure on the sidewall of the first conductive bump is less than a second angle between an exposed sidewall of the second conductive bump and a tangent line at an end point of a boundary of the second joint structure on the sidewall of the second conductive bump.

2. The method of claim 1, wherein forming each of the first conductive bump, the second conductive bump, the third conductive bump, and the fourth conductive bump comprises:
   forming a first copper-containing layer;
   forming a nickel-containing layer on the first copper-containing layer; and
   forming a second copper-containing layer on the nickel-containing layer.

3. The method of claim 2, wherein the first joint structure and the second joint structure comprise solder, forming the first joint structure and the second joint structure comprises:
   forming the first joint structure to at least cover the second copper-containing layers of the first conductive bump and the third conductive bump; and
   forming the second joint structure to at least cover the second copper-containing layers of the second conductive bump and the fourth conductive bump.

4. The method of claim 1, wherein a bump pitch of the third conductive bump and the fourth conductive bump is greater than a bump pitch of the first conductive bump and the second conductive bump.

5. The method of claim 1, wherein the first package component warps with an edge curving upwardly, and after forming the first joint structure and the second joint structure, the curvature of the first joint structure is greater than the curvature of the second joint structure.

6. The method of claim 1, wherein the first package component comprises a concave warpage profile, and after forming the first joint structure and the second joint structure, a maximum width of the first joint structure is greater than a maximum width of the second joint structure.

7. The method of claim 1, wherein a ratio of the dimension of the first conductive bump of the first package component to the dimension of the third conductive bump of the second package component is less than 1.

8. The method of claim 1, wherein forming the first package component comprises:
- forming the first conductive bump in a central region of the first package component; and
- forming the second conductive bump in a peripheral region of the first package component that surrounds the central region of the first package component.

9. The method of claim 1, wherein forming the second package component comprises:
- forming the third conductive bump at a corner of a semiconductor die of the second package component, wherein the third conductive bump is between the fourth conductive bump and a sidewall of the semiconductor die.

10. The method of claim 1, wherein forming the second package component comprises:
- providing a semiconductor die, wherein the semiconductor die comprises a semiconductor substrate, the third conductive bump and the fourth conductive bump are disposed over the semiconductor substrate, and the third conductive bump is closer to a sidewall of the semiconductor substrate than the fourth conductive bump; and
- forming an insulating encapsulation to cover the semiconductor die.

11. A method, comprising:
- forming an insulating encapsulation to laterally cover a first semiconductor die and a second semiconductor die, wherein each of the first semiconductor die comprises peripheral conductive bumps and central conductive bumps, the peripheral conductive bumps of the first semiconductor die are disposed on a peripheral region of the first semiconductor die that is between a central region of the first semiconductor die and the insulating encapsulation, and the peripheral conductive bumps of the second semiconductor die are disposed on a peripheral region of the second semiconductor die that is between a central region of the second semiconductor die and the insulating encapsulation;
- disposing a package component on the first semiconductor die, the second semiconductor die, and the insulating encapsulation, wherein the package component comprises central conductive bumps disposed on a central region of the package component and peripheral conductive bumps disposed on a peripheral region of the package component that surrounds the central region of the package component; and
- bonding the package component to the first semiconductor die and the second semiconductor die, wherein:
  - the central conductive bumps of the package component are bonded to the peripheral conductive bumps of the first semiconductor die and the peripheral conductive bumps of the second semiconductor die through first joint structures,
  - the peripheral conductive bumps of the package component are bonded to the central conductive bumps of the first semiconductor die and the central conductive bumps of the second semiconductor die through second joint structures,
  - the central conductive bumps and the peripheral conductive bumps of the package component comprise dimensions less than dimensions of the corresponding peripheral conductive bumps and the corresponding central conductive bumps of the first semiconductor die and the second semiconductor die, and
  - a first angle between a sidewall of the respective central conductive bump of the package component and a tangent line at an end point of a boundary of the corresponding first joint structure on the sidewall of the respective central conductive bump of the package component is less than a second angle between a sidewall of the respective peripheral conductive bump of the package component and a tangent line at an end point of a boundary of the corresponding second joint structure on the sidewall of the respective peripheral conductive bump of the package component.

12. The method of claim 11, wherein forming each of the central conductive bumps and the peripheral conductive bumps of the package component comprises:
- forming a first copper-containing layer;
- forming a nickel-containing layer on the first copper-containing layer; and
- forming a second copper-containing layer on the nickel-containing layer.

13. The method of claim 12, wherein after bonding the package component to the first semiconductor die and the second semiconductor die, the first joint structures and the second joint structures at least wrap the second copper-containing layers of the central conductive bumps and the peripheral conductive bumps of the package component.

14. The method of claim 11, wherein the first joint structures and the second joint structures comprise solder, and after bonding the package component to the first semiconductor die and the second semiconductor die, the respective first joint structure comprises a substantially oval shape cross-section with a first curvature, and the respective second joint structure comprises a substantially oval shape cross-section with a second curvature different from the first curvature.

15. The method of claim 11, wherein after bonding the package component to the first semiconductor die and the second semiconductor die, maximum widths of the first joint structures are greater than maximum widths of the second joint structures.

16. A method, comprising:
- forming an upper package component, wherein the upper package component comprises a central region, a peripheral region surrounding the central region, central conductive bumps disposed on the central region, and peripheral conductive bumps disposed on the peripheral region;
- forming a lower package component, wherein the lower package component comprises:
  - a first semiconductor die comprising a central region, a peripheral region surrounding the central region, a central conductive bump disposed on the central region, and a peripheral conductive bump disposed on the peripheral region;
  - a second semiconductor die comprising a central region, a peripheral region surrounding the central region, a central conductive bump disposed on the central region, and a peripheral conductive bump disposed on the peripheral region; and
  - an insulating encapsulation laterally covering the first and second semiconductor dies and between the peripheral regions of the first and second semiconductor dies; and
- forming first joint structures and second joint structures to connect the upper and lower package components, wherein:
  - one of the first joint structures wraps the peripheral conductive bump of the first semiconductor die and one of the central conductive bumps of the upper package component, and another one of the first joint structures wraps the peripheral conductive bump of the second semiconductor die and another one of the central conductive bumps of the upper package component, one of the second joint structures wraps the central conductive bump of the first semiconductor die and one of the peripheral conductive bumps of the upper package component, and another one of the second joint structures wraps the central conductive bump of the second semiconductor die and another one of the peripheral conductive bumps of the upper package component, a first angle between a sidewall of the one of the central conductive bumps of the upper package component and a tangent line at an end point of a boundary of the one of the first joint structures on the sidewall of the one of the central conductive bumps of the upper package component is less than a second angle between a sidewall of the one of the peripheral conductive bumps of the upper package component and a tangent line at an end point of a boundary of the one of the second joint structures on the sidewall of the one of the peripheral conductive bumps of the upper package component.

17. The method of claim 16, wherein each of the central and peripheral conductive bumps of the upper package component comprises an upper sidewall and a lower sidewall, and forming the first joint structures and the second joint structures comprises:

forming the first joint structures and the second joint structures to cover the lower sidewall and accessibly expose the upper sidewall.

18. The method of claim 16, wherein a ratio of the dimension of the one of the central conductive bumps of the upper package component to the dimension of the peripheral conductive bump of the first semiconductor die is less than 1.

19. The method of claim 16, wherein forming each of the central and peripheral conductive bumps of the upper package component and the central and peripheral conductive bumps of the first and second semiconductor dies comprises:

forming a first copper-containing layer;

forming a nickel-containing layer on the first copper-containing layer; and forming a second copper-containing layer on the nickel-containing layer.

20. The method of claim 19, wherein after forming the first joint structures and the second joint structures, at least the nickel-containing layer and the second copper-containing layer are accessibly exposed by a corresponding one of the first and second joint structures.

* * * * *